US011353793B2

United States Patent
Nagahara

(10) Patent No.: US 11,353,793 B2
(45) Date of Patent: Jun. 7, 2022

(54) METHOD OF SIMULATING RESIST PATTERN, RESIST MATERIAL AND METHOD OF OPTIMIZING FORMULATION THEREOF, APPARATUS AND RECORDING MEDIUM

(71) Applicant: Tokyo Electron Limited, Tokyo (JP)

(72) Inventor: Seiji Nagahara, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 317 days.

(21) Appl. No.: 16/545,868

(22) Filed: Aug. 20, 2019

(65) Prior Publication Data
US 2020/0057371 A1 Feb. 20, 2020

(30) Foreign Application Priority Data

Aug. 20, 2018 (JP) .............................. JP2018-154270
Feb. 22, 2019 (JP) .............................. JP2019-030674

(51) Int. Cl.
*G05B 19/4097* (2006.01)
*G03F 7/20* (2006.01)
(Continued)

(52) U.S. Cl.
CPC .......... *G03F 7/2002* (2013.01); *G03F 7/0035* (2013.01); *G03F 7/0042* (2013.01); *G03F 7/2022* (2013.01); *G03F 7/70033* (2013.01); *G05B 19/4097* (2013.01); *G05B 2219/45028* (2013.01)

(58) Field of Classification Search
CPC .... G03F 7/0035; G03F 7/0042; G03F 7/0045; G03F 7/095; G03F 7/16; G03F 7/2002; G03F 7/2022; G03F 7/203; G03F 7/70033; G03F 7/705; G05B 19/4097; G05B 2219/45028

See application file for complete search history.

(56) References Cited

U.S. PATENT DOCUMENTS

2019/0317410 A1\* 10/2019 Hansen ................... G03F 7/705

FOREIGN PATENT DOCUMENTS

JP 2002-174894 A 6/2002

OTHER PUBLICATIONS

Chris A. Mack, "Line-edge roughness and the ultimate limits of lithography," from "Proc. SPIE 7639, Advances in Resist Materials and Processing Technology XXVII, 763931 (Mar. 25, 2010)" (Year: 2010).\*

(Continued)

*Primary Examiner* — Yuhui R Pan
(74) *Attorney, Agent, or Firm* — Studebaker & Brackett PC

(57) ABSTRACT

A method of simulating a resist pattern according to an exemplary embodiment includes a step (A) of calculating a latent image of a concentration of an active species in a resist film that has been radiated by a radioactive ray along a target pattern with respect to a radiation position of the radioactive ray, a step (B) of calculating a change rate of the concentration with respect to the radiation position at an edge of the target pattern on the basis of the latent image, a step (C) of calculating a probabilistic variation at the edge of the target pattern, and a step (D) of calculating a variation in pattern edge roughness from the change rate of the concentration and the probabilistic variation.

9 Claims, 6 Drawing Sheets

(51) Int. Cl.
    *G03F 7/004*     (2006.01)
    *G03F 7/00*     (2006.01)

(56) References Cited

OTHER PUBLICATIONS

Carcasi et al. "Simulation and experimentation of PSCAR chemistry for complex structures" from Proc. SPIE 10143, Extreme Ultraviolet (EUV) Lithography VIII, 1014329 (Mar. 27, 2017) (Year: 2017).*

Kozawa et al. "Feasibility study of sub-10-nm half-pitch fabrication by chemically amplified resist processes of extreme ultraviolet lithography: I. Latent image quality predicted by probability density model" from Japanese Journal of Applied Physics 53, 106501 (2014) (Year: 2014).*

* cited by examiner

METHOD OF SIMULATING RESIST PATTERN, RESIST MATERIAL AND METHOD OF OPTIMIZING FORMULATION THEREOF, APPARATUS AND RECORDING MEDIUM

TECHNICAL FIELD

An exemplary embodiment of the present disclosure relates to a method of simulating a resist pattern, a resist material and a method of optimizing a formulation thereof, an apparatus and a recording medium.

BACKGROUND

As one of element technologies for manufacturing next-generation semiconductor devices, extreme ultraviolet (EUV) lithography is attracting attention. EUV lithography is a pattern-forming technique in which EUV light having a wavelength of 13.5 nm is used as an exposure light source. According to EUV lithography, it has been verified that an extremely fine pattern (for example, 20 nm or less) can be formed in an exposure step of a process for manufacturing a semiconductor device.

However, EUV light sources that have been developed so far have a low output, and thus a long period of time is required for an exposure treatment, which, consequently, leads to a huge obstacle to putting EUV lithography into practical use at the moment. In order to compensate for the low output of EUV light sources, improvement in the sensitivity of a resist material (photosensitive resin) can be considered (JP2002-174894A). The same problem as in EUV also exists in relation to the output and sensitivity of lithography in which electron beams, ion beams, or the like are used as a light source.

SUMMARY

Meanwhile, it is known that definition, the roughness of a resist pattern edge, and the sensitivity of a resist material have a trade-off relationship with each other and it is difficult to improve all of these characteristics at the same time. In addition, in the formation of a fine pattern, a variation in the dimensions of a pattern affects the yield of a device, and thus it is necessary to suppress the variation to a minimum. When an attempt is made to differentiate an exposed portion and a non-exposed portion and radiate EUV light (pattern exposure) in order to form an extremely fine pattern, a probabilistic variation (stochastics) is caused in a pattern-forming step.

As an example of the above-described stochastics, the short noise of a photon is exemplified. In the case of a radioactive ray having a large wavelength and being radiated to a relatively large area, even when a noise exists, the presence of the noise is ignorable in comparison with the output of the entire radioactive ray, which creates no problems. However, in the case of a radioactive ray having a small wavelength and a small output and being radiated to a small area like EUV light, the number of photons being radiated to the small area is approximately several hundreds to several thousands, which is extremely small. In this case, the amount of a noise with respect to all of the photons increases, which means the resultant variation in resist dimensions cannot be ignored.

As another example of the stochastics, the distribution or existence probability of an active species with respect to a radioactive ray in a resist material is exemplified. In the case of a radioactive ray having a large wavelength and being radiated to a relatively large area, the active species can be regarded as being almost uniformly distributed, and no problems are created. However, in the case of a radioactive ray having a small wavelength and a small output and being radiated to a small area, it becomes impossible to ignore the influence of the distribution or existence probability of the active species at a resist pattern edge on a variation in resist dimensions.

In EUV lithography, a variation in the dimensions of a resist pattern attributed to the probabilistic variation (stochastics) of the photons, the active species, and the like also results in defects of the resist pattern, and, accordingly, the yield of a device decreases. Therefore, it has been desired to build a method of optimizing the formation condition of a fine pattern with simulation in consideration of the probabilistic variation. However, in stochastic simulators of the related art, a simulation including each fluctuation using a random number is repeated once, massive trial runs and a long period of time are required to derive a variation in statistic pattern dimensions, and it is difficult to efficiently optimize a pattern formation condition.

The present disclosure provides a simulation method applicable to the formation of an extremely fine resist pattern in which a probabilistic variation (stochastics) can be caused and a method of efficiently optimizing a formulation of a resist material and a pattern formation condition. In addition, the present disclosure provides a resist material suitable for the formation of an extremely fine resist pattern and an apparatus and a recording medium to which the optimization method is applied.

DETAILED DESCRIPTION

Hereinafter, embodiments of the present disclosure will be described in detail with reference to drawings. In the description, the same element or elements having the same function will be given the same reference sign and will not be described again.

First Embodiment

As a first embodiment, a chemical amplification-type resist material and a method of optimizing a formulation thereof will be described. The chemical amplification-type resist material regulated in the present embodiment (hereinafter, simply referred to as "resist material" in some cases) includes a base component, a photo-acid-generating agent (PAG), and a quencher. The resist material is applied onto a substrate or the like and forms a resist film. A radioactive ray (including an electron beam, which shall be true below) having a wavelength of 300 nm or less is radiated to the resist film along a pattern to be formed (pattern exposure), and an acid is generated only in the resist film in a radioactive ray-radiated portion. The generated acid removes an acid unstable group (protective group) of the base component in the resist film by post exposure baking (PEB) and changes the polarity (deprotection). After that, the resist film is treated with a developer, thereby forming a resist pattern. Generally, the base component includes a polymer protected by the protective group.

The photo-acid-generating agent generates an acid at a predetermined decomposition rate by being radiated with a radioactive ray having a wavelength of 300 nm or less. After that, due to an acid catalytic reaction associated with heating, the solubility in the developer of the base component that is included in the resist film changes, and the development of the resist film becomes possible. The quencher has a function of trapping an ambient acid. The quencher may be a photodecomposable quencher (PDB). When radiated with a radioactive ray, the photodecomposable quencher decomposes at a predetermined rate and loses the function of trapping an acid. In the present specification, a quencher that is not photodecomposable can be regarded as a quencher having a decomposition rate of zero.

Figure 1:
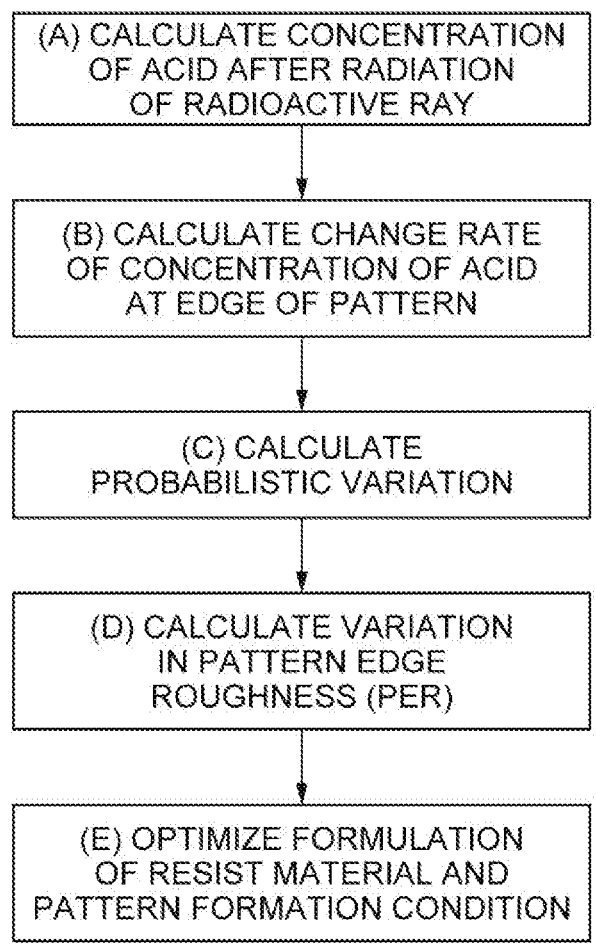
FIG. 1 is a flowchart illustrating individual steps of an optimization method according to an embodiment of the present disclosure.

The optimization method according to the present embodiment is a method of optimizing the formulation and the pattern formation condition of the chemical amplification-type resist material that is used as described above. FIG. 1 is a flowchart illustrating individual steps of the optimization method according to the present embodiment. As illustrated in FIG. 1, the method according to the present embodiment includes a step A to a step D described below and includes a step E in some cases. The individual steps will be described below in detail. The individual steps can be executed using a computer.

Step A

Figure 2:
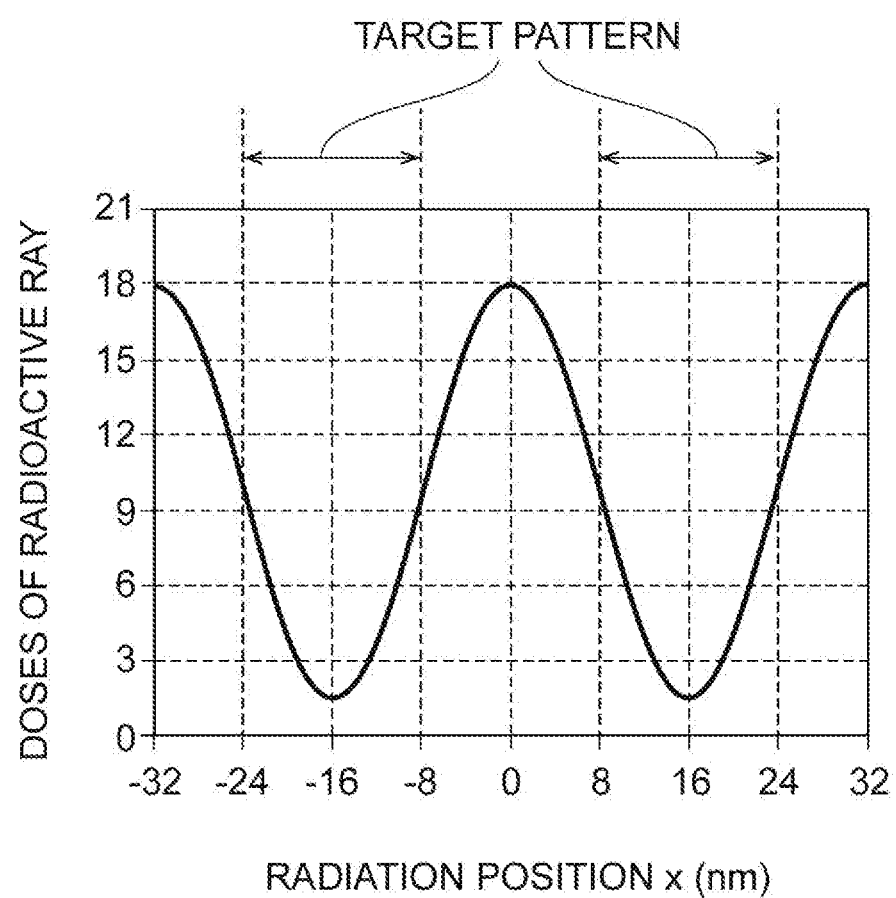
FIG. 2 is a view illustrating an example of an optical image of a radioactive ray being radiated along a target pattern during pattern exposure.

The step A is a step of calculating a latent image of the concentration of the acid in the resist film that has been radiated by the radioactive ray along a target pattern with respect to a radiation position of the radioactive ray. FIG. 2 is a view illustrating an example of an optical image of the radioactive ray being radiated along the target pattern in the pattern exposure. In FIG. 2, the doses of the radioactive ray in the positions of the target pattern are decreased, and the doses of the radioactive ray in positions other than the target pattern are increased. When the radioactive ray is radiated to the resist film, an acid is generated from the photo-acid-generating agent, and the photodecomposable quencher decomposes. However, in the case of being not photodecomposable, the quencher does not decompose. Some of the generated acid is trapped by the quencher that does not decompose and remains.

Figure 3:
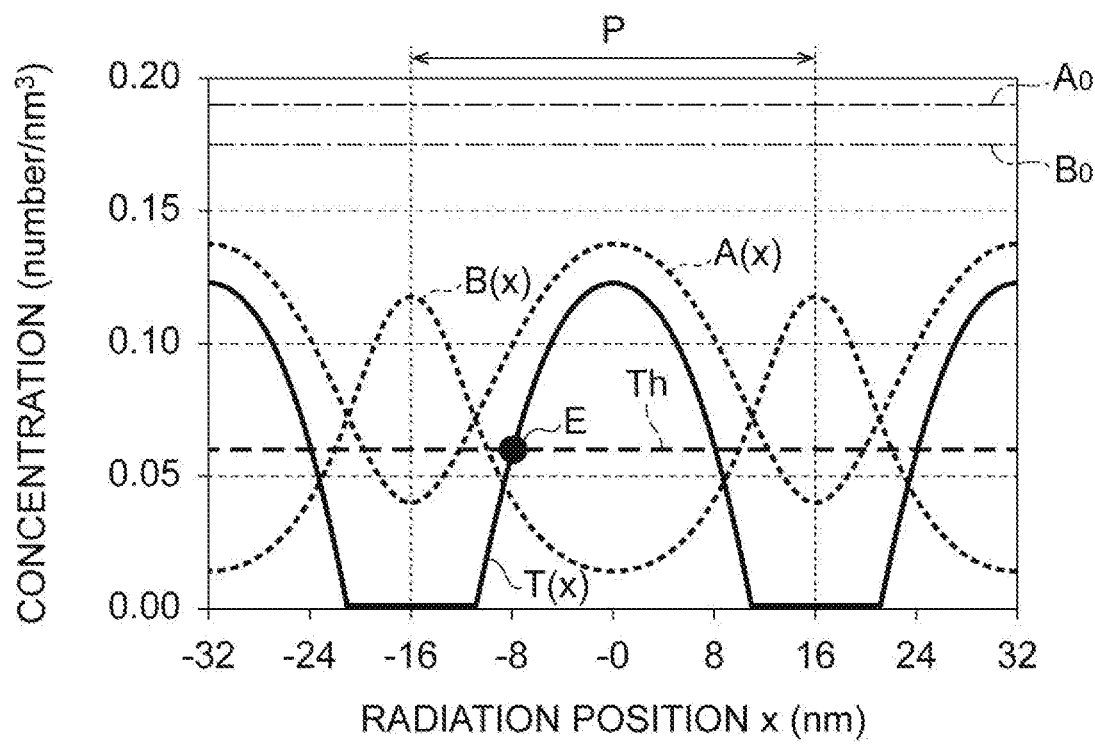
FIG. 3 is a view illustrating an example of a simulation result of a part of a step A in a method according to the present embodiment regarding a distribution of a concentration of a chemical species in a resist film after radiation of a radioactive ray.

FIG. 3 is a view illustrating an example of a simulation result of a part of the step A in the method according to the present embodiment regarding the distribution of the concentration of a chemical species in the resist film after the radiation of the radioactive ray. At a random radiation position x, when the concentration of the acid generated from the photo-acid-generating agent after the radiation of the radioactive ray is represented by $A(x)$, and the concentration of the quencher after the radiation of the radioactive ray is represented by $B(x)$, the concentration $T(x)$ of the acid remaining after the radiation of the radioactive ray is represented by Expression (1). In Expression (1), all of the acid and the quencher are assumed to be neutralized.

$$T(x) = A(x) - B(x) \tag{1}$$

Furthermore, in the present embodiment, $A(x)$ and $B(x)$ are assumed to behave as Expressions (2a) and (2b). $A(x)$ and $B(x)$ are respectively indicated using broken lines in FIG. 3.

$$A(x) = A_0(1 - \exp(-C_a E(x))) = A_0\left(1 - \exp\left(-C_a E_0\left(a + b\cos\left(\frac{2\pi x}{P}\right)\right)\right)\right) \tag{2a}$$

$$B(x) = B_0 \exp(-C_a E(x)) = B_0 \exp\left(-C_b * E_0\left(a + b\cos\left(\frac{2\pi x}{P}\right)\right)\right) \tag{2b}$$

Here, $E(x)$ in Expressions (2a) and (2b) represents a profile of the doses of the radioactive ray and is approximated as Expression (2c), which will be described later. FIG. 2 is a visualized profile of the doses of the radioactive ray approximated as Expression (2c). The profile of the doses of the radioactive ray is desirably a profile close to a rectangular shape; however, in the present embodiment, the profile of the doses of the radioactive ray is approximated as Expression (2c) (that is, FIG. 2). In Expressions (2a) to (2c), $A_0$ represents the number (content or concentration) of the photo-acid-generating agent in the resist film before the radiation of the radioactive ray (number/nm$^3$), $B_0$ represents the number (content or concentration) of the quencher in the resist film before the radiation of the radioactive ray (number/nm$^3$), a represents an offset parameter, b represents a contrast parameter that regulates the amplitude of a signal, $C_a$ represents an acid generation rate (cm$^2$/mJ) from the photo-acid-generating agent by the radioactive ray, $C_b$ represents a decomposition rate (cm$^2$/mJ) of the quencher by the radioactive ray, $E_0$ represents an exposure amount (mJ/cm$^2$) of the radioactive ray set in a stepper, and P represents a pattern pitch (the center-to-center distance (nm) of resist patterns adjacent to each other (refer to FIG. 3)). $A_0$ and $B_0$ can be converted from the contents (% by mass) and the like of the photo-acid-generating agent and the quencher on the basis of the formulation of the resist material. $C_a$ and $C_b$ are respectively the rate constants intrinsic to compounds that are used as the photo-acid-generating agent and the quencher. In a case where $C_b$ is a value exceeding zero, it means that the quencher is a photodecomposable quencher. The acid generation rate of the photo-acid-generating agent and the decomposition rate of the photodecomposable quencher are values when a radioactive ray having a wavelength of 13.5 nm (EUV) is radiated.

$$E(x) = E_0\left(a + b\cos\left(\frac{2\pi x}{P}\right)\right) \tag{2c}$$

Meanwhile, originally, the profile of the doses of the radioactive ray is supposed to be obtained in consideration of high-order diffracted light. However, in an extremely fine pattern, high-order diffracted light is considered to be incapable of penetrating an exposure lens, and thus the profile of the doses of the radioactive ray is approximated by simplified fitting in which only low-order diffracted light (zero-order light or primary light) is taken into account. In order to further increase the accuracy, fitting may be carried out in consideration of the distribution shape of light including high-order light. a which is an offset parameter and b which is a contrast parameter are determined depending on the optical conditions (for example, NA, a σ value, and the like) of a lighting shape and the like which are set in a stepper.

Therefore, in the present embodiment, the distribution of the concentration of the acid (the latent image of the acid) with respect to: the radiation position of the radioactive ray in the resist film that has been radiated by the radioactive ray along the target pattern is calculated as Expression (3). T(x) is indicated using a solid line in FIG. 3.

$$T(x) = A_0\left(1 - \exp\left(-C_a E_0\left(a + b\cos\left(\frac{2\pi x}{P}\right)\right)\right)\right) - B_0 \exp\left(-C_b E_0\left(a + b\cos\left(\frac{2\pi x}{P}\right)\right)\right) \quad (3)$$

In the present embodiment, the concentration A(x) of the acid generated from the photo-acid-generating agent after the radiation of the radioactive ray and the concentration B(x) of the photodecomposable quencher remaining after the radiation of the radioactive ray are assumed to behave as Expressions (2a) to (2c). That is, a case where a secondary electron is generated by EUV lithography and the generated secondary electron is trapped by the photo-acid-generating agent or the quencher and decomposes is not considered, and thus more efficient optimization becomes possible. In a case where there is no problem with the calculation speed, the concentration calculation of a continuous body model in which a reaction of a secondary electron is also considered, which is used in an ordinary lithography simulator, may also be used.

Step B

The step B is a step of calculating a change rate of the concentration of the acid remaining after the radiation of the radioactive ray with respect to the radiation position at an edge of the target pattern on the basis of the latent image calculated in the step A. The change rate of the concentration T(x) of the acid remaining after the radiation of the radioactive ray at a random radiation position x is the differentiation of T(x) by x (dT/(x))/dx and is thus calculated as Expression (4).

$$\frac{dT(x)}{dx} = -C_a E_0 b \frac{2\pi}{P}\sin\left(\frac{2\pi x}{P}\right)A_0\exp\left(-C_a E_0\left(a + b\cos\left(\frac{2\pi x}{P}\right)\right)\right) - C_b E_0 b \frac{2\pi}{P}\sin\left(\frac{2\pi x}{P}\right)B_0\exp\left(-C_b E_0\left(a + b\cos\left(\frac{2\pi x}{P}\right)\right)\right) \quad (4)$$

Next, for example, in the example of FIG. 2, the position of the pattern edge of the target pattern is temporarily set at −P/4. In this case, x is −P/4, and thus the target pattern T(−P/4) is calculated as Expression (5).

$$\frac{dT\left(-\frac{P}{4}\right)}{dx} = E_0 b \frac{2\pi}{P}(C_a A_0 \exp(-C_a E_0 a) + C_b B_0 \exp(-C_b E_0 a)) \quad (5)$$

Here, when A(−P/4) is represented by A, and B(−P/4) is represented by B, Expressions (6a) and (6b) are obtained, and, when T(−P/4) is represented by T, Expression (6c) is obtained.

$$A\left(-\frac{P}{4}\right) = A_0 - A_0\exp(-C_a E_0 a) = A \quad (6a)$$
$$A_0\exp(-C_a E_0 a) = A_0 - A$$

$$B\left(-\frac{P}{4}\right) = B_0\exp(-C_b E_0 a) = B \quad (6b)$$
$$B_0\exp(-C_b E_0 a) = B_0 - B$$

$$T\left(-\frac{P}{4}\right) = A - B = A_0(1 - \exp(-C_a E_0 a)) - B_0\exp(-C_b E_0 a) = T \quad (6c)$$

Therefore, the change rate (Acid $ILS_T$) of the concentration of the acid standardized to the concentration T (=A−B) of the acid remaining after the radiation of the radioactive ray is calculated as Expression (7a). In addition, the change rate (Acid $ILS_{A0}$) of the concentration of the acid standardized to the concentration $A_0$ of the photo-acid-generating agent before the radiation of the radioactive ray is calculated as Expression (7b).

$$\text{Acid } ILS_T = \frac{\left(\frac{dT\left(-\frac{P}{4}\right)}{dx}\right)}{T} = \frac{2\pi E_0 b(C_a(A_0 - A) + C_b B)}{P(A - B)} \quad (7a)$$

$$\text{Acid } ILS_{A_0} = \frac{\left(\frac{dT\left(-\frac{P}{4}\right)}{dx}\right)}{A_0} = \frac{2\pi E_0 b(C_a(A_0 - A) + C_b B)}{A_0} \quad (7b)$$

The change rate of the concentration of the acid standardized by the pattern size can be expressed as Expression (8a) by assigning the pattern size (P/2) into Expression (7a). Similarly, the change rate of the concentration of the acid standardized by the pattern size can be expressed as Expression (8b) by assigning the pattern size (P/2) into Expression (7b).

$$\text{Acid } NILS_T = \frac{\left(\frac{P}{2}\frac{dT\left(-\frac{P}{4}\right)}{dx}\right)}{T} = \frac{E_0 b\pi(C_a(A_0 - A) + C_b B)}{A - B} \quad (8a)$$

$$\text{Acid } NILS_{A_0} = \frac{\left(\frac{P}{2}\frac{dT\left(-\frac{P}{4}\right)}{dx}\right)}{A_0} = \frac{E_0 b\pi(C_a(A_0 - A) + C_b B)}{A_0} \quad (8b)$$

In the present embodiment, the change rate of the concentration of the acid after the radiation of the radioactive ray is assumed to behave in a simplified manner as described above. However, the calculation of the latent image or change rate of the average concentration of a chemical substance which does not take the above-described variation into account does not demand any calculation with a high burden. Therefore, the calculation of the latent image or change rate of the average concentration of a chemical substance may be calculated using the same simulation method as a variety of simulation methods of the related art relating to a chemical substance in a resist film (for example, KLA Corporation's PROLITH, Synopsys, Inc.'s S-Litho, or the like). In a case where there is no problem with the calculation speed, even a parameter relating to the diffusion of a substance, the generation efficiency of the secondary electron, the rate constant of a neutralization reaction, and a parameter relating to a deprotection reaction may be analyzed. In addition, the change rate of the concentration of the acid may be calculated by evaluating the slope of an image (an image of a polar group or a non-polar group) after the change in the polarity of the base component after post exposure baking (PEB).

Step C

The step C is a step of calculating a probabilistic variation (stochastics) at the edge of the target pattern. First, in the present embodiment, the short noise of a photon is simplified as Expression (9). In Expression (9), $\sigma_p$ represents a standard deviation of the variation of a photon, $\langle N_P \rangle$ represents an average value of the numbers of photons incident on a specific region, and V represents a volume of a certain specific region.

$$\frac{\sigma_P}{\langle N_P \rangle} = \frac{1}{\sqrt{\langle N_P \rangle}} \qquad (9)$$

Here, when the presence of a proportional relationship in the variation in the concentration of the acid generated by the variation of the photon is approximated, a value obtained by standardizing the standard deviation of the variation in the concentration of the acid attributed to the variation of the photon with a concentration of the acid that is a threshold value of the reaction can be expressed as Expression (9a).

$$\left\{ \frac{\sigma_A}{\langle N_T \rangle} \right\}_{Ph} = \frac{AV}{TV} \frac{1}{\sqrt{\langle N_P \rangle}} \qquad (9a)$$
$$= \frac{A}{T} \frac{1}{\sqrt{\langle N_P \rangle}}$$
$$= \left(1 + \frac{B}{P}\right) \frac{1}{\sqrt{\langle N_P \rangle}}$$

Similarly, when the presence of a proportional relationship in the variation in the decomposition concentration of the quencher generated by the variation of the photon is approximated, a value obtained by standardizing the standard deviation of the variation in the concentration of the quencher attributed to the variation of the photon with the concentration of the acid that is the threshold value of the reaction can be expressed as Expression (9b).

$$\left\{ \frac{\sigma_B}{\langle N_T \rangle} \right\}_{Ph} = \frac{B_0 V - BV}{TV} \frac{1}{\sqrt{\langle N_P \rangle}} \qquad (9b)$$
$$= \frac{B_0 - B}{T} \frac{1}{\sqrt{\langle N_P \rangle}}$$

In the above-described handling, for the simplification of calculation, the variation in the generation of the acid and the decomposition of the quencher is approximated to linearly response to the variation of the photon. As a result, the variation in the concentration of the acid at a position with the threshold value of the acid at which the resist film is developed can be expressed as Expression (9c) due to the influence of the variation in the concentrations of the acid and the quencher.

$$\left\{ \frac{\sigma_T}{\langle N_T \rangle} \right\}_{Ph} = \sqrt{\left(\frac{\sigma_A}{\langle N_T \rangle}\right)^2 + \left(\frac{\sigma_A}{\langle N_T \rangle}\right)^2} \qquad (9c)$$
$$= \sqrt{\left(\frac{A}{T} \frac{1}{\sqrt{\langle N_P \rangle}}\right)^2 + \left(\frac{B_0 - B}{T} \frac{1}{\sqrt{\langle N_P \rangle}}\right)^2}$$
$$= \frac{\sqrt{A^2 + (B_0 - B)^2}}{T\sqrt{\langle N_P \rangle}}$$
$$= \frac{\sqrt{(T+B)^2 + (B_0 - B)^2}}{T\sqrt{\langle N_P \rangle}}$$
$$= \frac{\sqrt{T^2 + 2B^2 + B_0^2}}{T\sqrt{\langle N_P \rangle}}$$

In addition, a value obtained by standardizing the standard deviation of the variation in the concentration of the acid attributed to the distribution or existence probability (variation) of the concentration of the photo-acid-generating agent after the radiation of the radioactive ray with the concentration of the acid that is the threshold value of the reaction can be expressed as Expression (10a). In addition, a value obtained by standardizing the standard deviation of the variation in the concentration of the quencher attributed to the distribution or existence probability (variation) of the concentration of the quencher after the radiation of the radioactive ray with the concentration of the acid that is the threshold value of the reaction can be expressed as Expression (10b).

$$\left\{ \frac{\sigma_A}{\langle N_T \rangle} \right\}_{Ch} = \frac{\sqrt{\langle N_A \rangle}}{\langle N_T \rangle} = \frac{\sqrt{AV}}{TV} = \frac{1}{T}\sqrt{\frac{A}{V}} \qquad (10a)$$

$$\left\{ \frac{\sigma_B}{\langle N_T \rangle} \right\}_{Ch} = \frac{\sqrt{\langle N_B \rangle}}{\langle N_T \rangle} = \frac{\sqrt{BV}}{TV} = \frac{1}{T}\sqrt{\frac{B}{V}} \qquad (10b)$$

Therefore, the distribution or existence probability of the concentration of the acid after the radiation of the radioactive ray is regarded as being affected by both the concentration of the acid and the concentration of the quencher and is simplified as Expression (10c).

$$\left\{ \frac{\sigma_T}{\langle N_T \rangle} \right\}_{Ch} = \sqrt{\left(\left\{\frac{\sigma_A}{\langle N_T \rangle}\right\}_{Ch}\right)^2 + \left(\left\{\frac{\sigma_B}{\langle N_T \rangle}\right\}_{Ch}\right)^2} \qquad (10c)$$
$$= \sqrt{\left(\frac{1}{T}\sqrt{\frac{A}{V}}\right)^2 + \left(\frac{1}{T}\sqrt{\frac{B}{V}}\right)^2}$$
$$= \frac{1}{T}\sqrt{\frac{A+B}{V}}$$
$$= \frac{1}{T}\sqrt{\frac{T+2B}{V}}$$

When summarized on the basis of the above description, the variation (stochastics) by the short noise of the photon and the distribution or existence probability of the concentration of the acid after the radiation of the radioactive ray is calculated as Expression (11).

$$\frac{\sigma_T}{\langle N_T \rangle} = \sqrt{\left(\left\{\frac{\sigma_T}{\langle N_T \rangle}\right\}_{Ch}\right)^2 + \left(\left\{\frac{\sigma_T}{\langle N_T \rangle}\right\}_{Ph}\right)^2} \quad (11)$$

$$= \sqrt{\left(\frac{1}{T}\sqrt{\frac{T+2B}{V}}\right)^2 + \left(\sqrt{\frac{T^2 + 2B^2 + B_0^2}{\langle NP \rangle}}\right)^2}$$

$$= \frac{1}{T}\sqrt{\frac{T+2B}{V} + \frac{T^2 + 2B^2 + B_0^2}{\langle N_P \rangle}}$$

When the stochastics is calculated as described above, it is possible to obtain the concentration variation of the acid as an average value without carrying out stochastic simulation in which a random number is used a number of times.

Step D

In the step D, a variation in pattern edge roughness (pattern dimension variation) is calculated from the change rate of the concentration calculated in the step B and the probabilistic variation calculated in the step C. That is, as in Expression (12), the dimension of the probabilistic variation is converted to the dimension of the radiation position of the radioactive ray by dividing the probabilistic variation of the step C by the change rate of the step B, whereby a noise index that is an index of the dimension variation attributed to the probabilistic variation is calculated as the variation in pattern edge roughness. Here, $N_{index}$ represents the noise index. In addition, a coefficient n is a parameter that regulates in what pattern dimension based on a multiple of the standard deviation to discuss the noise index. As an ordinary example, it is common to discuss the noise index with n of 3.

$$N_{index} = \frac{n\left(\frac{\sigma_T}{\langle N_T \rangle}\right)}{\text{Acid } ILS_T} \quad (12)$$

$$= n\frac{\frac{1}{T}\sqrt{\frac{T+2B}{V} + \frac{T^2 + 2B^2 + B_0^2}{\langle N_P \rangle}}}{\frac{2\pi E_0 b(C_a(A_0 - A) + C_b B)}{PT}}$$

$$= n\frac{P\sqrt{\frac{T+2B}{V} + \frac{T^2 + 2B^2 + B_0^2}{\langle N_P \rangle}}}{E_0 b\pi(C_a(A_0 - A) + C_b B)}$$

When the noise index $N_{index}$ that is an evaluation function obtained in the step D is equal to or less than a certain threshold value, the set pattern formation condition enables determination that the variation in pattern edge roughness is sufficiently decreased even when the stochastics is taken into account. As the threshold value, a desired value may be appropriately selected, and, for example, when n is 3, the threshold value can be 3.0 nm, 1.5 nm, or the like. In addition, in the present method, calculation can be sped up. In methods of the related art, a single trial run (a trial run to calculate the noise index under a certain condition) takes several minutes to several hours; however, in the steps A to D, the calculation does not take even several seconds.

Step E

In the present embodiment, the change ranges of the individual parameters are regulated in the step D, and then, in the step E, recalculation is carried out to obtain a smaller noise index $N_{index}$ in the change ranges, and the formulation of the resist material, the pattern formation condition, and the like are optimized. Optimization in the present disclosure refers to a method of finding a combination of the parameters so that the evaluation function $N_{index}$ of the roughness is minimized. As the evaluation function, not only an index relating to a noise but also a separate evaluation index such as a process window (an exposure amount margin or a focus margin) may be applied. That is, the parameters can also be optimized so that the evaluation function of a critical dimension (CD) error including an input value obtained by changing the values such as the exposure amount, the focus, and mask dimensions as the radiation condition of the radioactive ray is minimized. In other words, the formulation of the resist material may be optimized by recalculating the variation in pattern edge roughness by changing the formulation of the resist material or the radiation condition of the radioactive ray and thereby selecting a formulation of the resist material with which the range of the radiation condition of the radioactive ray that leads to the variation in pattern edge roughness of equal to or less than a target value, becomes wider. As an optimization method, it is possible to use, for example, an optimization algorithm using a gradient such as a method of steepest descent, a genetic algorithm, a pattern search method, or a GRG nonlinear method.

The step E is a step of repeating the calculation of the variation in pattern edge roughness by changing the formulation of the resist material or the radiation condition of the radioactive ray and thereby selecting a formulation of the resist material with which a calculation result of a smaller variation in pattern edge roughness can be obtained. As the parameters of the formulation of the resist material to be changed, the number of the photo-acid-generating agent before the radiation of the radioactive ray $A_0$, the number of the photodecomposable quencher $B_0$, the reaction rate $C_a$ of the acid generation (acid generation rate) from the photo-acid-generating agent by the radioactive ray, the decomposition rate $C_b$ of the quencher by the radioactive ray, and the like are exemplified. In addition, as the parameters of the radiation condition of a radioactive ray to be changed, the exposure amount $E_0$ of the radioactive ray and the like are exemplified. As long as there is no problem with the calculation speed, even the parameter relating to the diffusion of a substance, the generation efficiency of the secondary electron, the rate constant of the neutralization reaction, and the parameter relating to the deprotection reaction may be analyzed. In addition, the variation in hydrophilic group (or the number of protective groups that are not deprotected) after the deprotection may be evaluated. The calculation methods in the step E are the same as those in the step D. The individual parameters can be values obtained by minimizing in advance the error between simulation values and experimental values by calibration with reference to the experimental values.

Second Embodiment

As a second embodiment, a photosensitization chemical amplification-type resist material and a method of optimizing a formulation thereof will be described. The photosensitization chemical amplification-type resist material (hereinafter, simply referred to as "resist material" in some cases)

further includes a photosensitizer precursor in addition to a base component (a polymer protected by a protective group), a photo-acid-generating agent, and a photodecomposable quencher. The resist material is applied onto a substrate or the like and forms a resist film. A radioactive ray having a wavelength of 300 nm or less is radiated to the resist film along a pattern to be formed (pattern exposure). The radiation of a radioactive ray having a wavelength of 300 nm or less generates an acid in the resist film, and, due to a reaction by the acid, the photosensitizer precursor decomposes at a predetermined rate, thereby generating a photosensitizer. After that, a radioactive ray having a wavelength of more than 300 nm is radiated to the entire surface of the resist film (overall exposure (also referred to as collective exposure)). The photosensitizer generated by the pattern exposure decomposes the photo-acid-generating agent in the overall exposure by a sensitization reaction and induces the generation of an additional acid. Therefore, only a pattern-exposed portion is selectively sensitized, and the sensitivity of the resist material is significantly increased. Similarly, the photosensitizer generated by the pattern exposure is also capable of decomposing the photodecomposable quencher in the overall exposure by a sensitization reaction and increasing the amount of an active acid in an area in which the photosensitizer exists. As a result, the contrast of the latent image of the acid between the pattern-exposed portion and a non-pattern-exposed portion improves, and it is possible to improve definition, the roughness of a resist pattern edge, and the sensitivity of the resist material at the same time.

In the case of the photosensitization chemical amplification-type resist as well, similar to ordinary resists, the tendency of a pattern dimension variation can be assumed. That is, the tendency can be assumed using a value obtained by dividing the average variation in the concentration of the acid by the slope of the concentration of the acid after the trapping (neutralization) of the acid by the quencher (or the concentration of a polymer that is not deprotected and remains protected even after post exposure baking). In the present embodiment, it is also possible to obtain the pattern dimension variation by adding the amount of the acid that is generated by the overall exposure to the amount of the acid that is generated by the pattern exposure and remains without being neutralized. That is, the pattern dimension variation can be obtained by repeating the step A described in the first embodiment in the pattern exposure and the overall exposure and summing the amounts of the acid. At that time, it is also possible to recognize the image of Expression (2c) used as the optical image in the step A as a latent image of the photosensitizer generated from the photosensitizer precursor after the pattern exposure and predict the generation of an acid during the overall exposure. Alternatively, the direction of the optimization of the formulation of the resist material can also be predicted by further simplifying the simulation and carrying out prediction in the same manner as in the first embodiment by combining the pattern exposure and the overall exposure. That is, the variation in the amount of the acid generated during the overall exposure attributed to the variation of a photon can be assumed by considering that, for example, the variation in the concentration of the photosensitizer that is generated after the pattern exposure is proportional to the variation in the concentration of the acid obtained from the variation of the photon.

A method of forming a resist pattern using the photosensitization chemical amplification-type resist material includes, for example, a step of radiating a radioactive ray having a wavelength of 300 nm or less to a resist film including the photosensitization chemical amplification-type resist material along a target pattern (pattern exposure), a step of baking the resist film (first baking), a step of exposing overall the resist film, a step of baking the resist film again (second baking), and a step of forming a resist pattern by the development of the resist film in this order. Due to the pattern exposure, in a portion along the target pattern on the resist film, the photo-acid-generating agent decomposes and generates an acid, and the photodecomposable quencher also decomposes. In the first baking, the photosensitizer precursor is decomposed by the acid, and a photosensitizer is generated. In addition, the quencher can be neutralized by the acid. After the pattern exposure, there is a case where it is not necessary to heat the resist film for baking and the photosensitizer is sufficiently generated by heat or the like generated by the pattern exposure. In that case, the first baking may not be carried out, and the pattern-exposed resist film may be left to stand until the overall exposure without being heated. In this case, the concentrations of individual components described below and a variation thereof are calculated by regarding a region caused between the end of the pattern exposure and the overall exposure as a reaction of the first baking. Due to the overall exposure, the generation of the acid from the photo-acid-generating agent and the decomposition of the photodecomposable quencher are accelerated by the photosensitizer. Due to the second baking, the desorption of the protective group from the protected polymer proceeds in the presence of the acid generated from the photo-acid-generating agent. In addition, some of the acid generated from the photo-acid-generating agent is consumed to neutralize the quencher. A development treatment using a developer removes a portion including the deprotected polymer in a concentration equal to or higher than the threshold value from the resist film and thus forms a resist pattern. In the case of this method, the formulation of the photosensitization chemical amplification-type resist material can be optimized on the basis of the change rate of the concentration of the polymer protected by the protective group at the edge of the target pattern and the probabilistic variation in concentration. An example of this method will be described below.

Step A

In a step A, a latent image of the concentration of the polymer protected by the protective group with respect to a radiation position of the radioactive ray after the second baking is calculated. Here, deprotection reactions proceeding in the first baking and the second baking are taken into account. In order for that, the concentrations of the individual components in individual steps are sequentially calculated as described below.

A latent image $H(x)$ of the concentration of the acid after the pattern exposure is represented by Expression (20a) in the same way of thinking as Expression (2a) of the first embodiment. Therefore, a concentration $H_e$ of the acid at a position of the edge ($x=-P/4$) of the target pattern is calculated as Expression (21a). $G_0$ represents an initial concentration (a concentration before EUV radiation) of the photo-acid-generating agent, and $C_{h1}$ represents a reaction rate (or a reaction rate constant) during the generation of the acid from the acid-generating agent by EUV radiation. $E(x)$ represents a profile of the doses of the radioactive ray, and $E_{h0}$ represents the amount of the radioactive ray absorbed by the acid-generating agent. a represents an offset parameter, b represents a contrast parameter that regulates the amplitude of a signal, and P represents a pattern pitch of the target pattern.

$$H(x) = G_0(1 - \exp(-C_{h1}E(x))) \quad (20a)$$
$$= G_0\left(1 - \exp\left(-C_{h1}E_{h0}\left(a + b\cos\left(\frac{2\pi x}{P}\right)\right)\right)\right)$$

$$H\left(-\frac{P}{4}\right) = G_0\left(1 - \exp\left(-C_{h1}E_{h0}\left(a + b\cos\left(-\frac{\pi}{2}\right)\right)\right)\right) \quad (21a)$$
$$= G_0(1 - \exp(-C_{h1}E_{h0}a))$$
$$= H_e$$

A concentration Q(x) (latent image) of the quencher after the pattern exposure is represented by Expression (20b) in the same way of thinking as Expression (2b) of the first embodiment. Therefore, a concentration Qe of the quencher at the position (x=−P/4) of the edge of the target pattern is calculated as Expression (21b). $Q_0$ represents the initial concentration (the concentration before the pattern exposure) of the photo-acid-generating agent. $C_{q1}$ represents a reaction rate constant during the generation of the quencher (a reverse reaction of the decomposition of the quencher). E(x) represents the profile of the doses of the radioactive ray, and $E_{q0}$ represents the amount of the radioactive ray absorbed by the quencher. a represents the offset parameter, b represents the contrast parameter that regulates the amplitude of a signal, and P represents the pattern pitch.

$$Q(x) = Q_0 \exp(-C_{q1}E(x)) \quad (20b)$$
$$= Q_0 \exp\left(-C_{q1}E_{q0}\left(a + b\cos\left(\frac{2\pi x}{P}\right)\right)\right)$$

$$Q\left(-\frac{P}{4}\right) = Q_0 \exp\left(-C_{q1}E_{q0}\left(a + b\cos\left(-\frac{\pi}{2}\right)\right)\right) \quad (21b)$$
$$= Q_0 \exp(-C_{q1}E_{q0}a)$$
$$= Q_e$$

A concentration G(x) (latent image) of the acid-generating agent after the pattern exposure is represented by Expression (20c). Therefore, a concentration Ge of the acid-generating agent at the position (x=−P/4) of the edge of the target pattern is calculated as Expression (21c). $G_0$ represents the initial concentration (the concentration before the pattern exposure) of the photo-acid-generating agent. $C_{h1}$ represents a reaction rate constant during the generation of the acid from the acid-generating agent by EUV radiation. E(x) represents the profile of the doses of the radioactive ray, and $E_{h0}$ represents the amount of the radioactive ray absorbed by the acid-generating agent. a represents the offset parameter, b represents the contrast parameter that regulates the amplitude of a signal, and P represents the pattern pitch.

$$G(x) = G_0 - H(x) \quad (20c)$$
$$= G_0 \exp(-C_{h1}E(x))$$
$$= G_0 \exp\left(-C_{h1}E_{h0}\left(a + b\cos\left(\frac{2\pi x}{P}\right)\right)\right)$$

$$G\left(-\frac{P}{4}\right) = G_0 \exp\left(-C_{h1}E_{h0}\left(a + b\cos\left(-\frac{\pi}{2}\right)\right)\right) \quad (21c)$$
$$= G_0 \exp(-C_{h1}E_{h0}a)$$
$$= G_e$$

$E_{h0}$ and $E_{q0}$ may be corrected using Expressions (22a) and (22b) in consideration of the decomposition rates of the photo-acid-generating agent and the quencher by a secondary electron. $E_0$ represents the amount of the radioactive ray of EUV, $G_0$ represents the initial concentration (the concentration before the pattern exposure) of the photo-acid-generating agent, and $Q_0$ represents the initial concentration (the concentration before the pattern exposure) of the quencher. $R_h$ represents a reaction rate constant of the decomposition of the acid-generating agent and is generally approximately one. $R_q$ represents a reaction rate constant of the decomposition of the quencher and is generally approximately one, but is zero when the quencher is an amine. It may be approximated that, with an assumption that $R_h$ is equal to $R_q$ in Expressions (22a) and (22b), the amounts $E_{h0}$ and $E_{q0}$ of the radioactive ray absorbed by the acid-generating agent and the photodecomposable quencher are the amounts of the radioactive ray distributed to the photo-acid-generating agent and the photodecomposable quencher in the same ratio as the ratio between the initial concentrations $G_0$ and $Q_0$ of the photo-acid-generating agent and the photodecomposable quencher.

$$E_{h0} = \frac{R_h G_0}{R_h G_0 + R_q Q_0} E_0 \quad (22a)$$

$$E_{q0} = \frac{R_q Q_0}{R_h G_0 + R_q Q_0} E_0 \quad (22b)$$

In the first baking, the concentration $H_1$ of the acid decreases from He at a rate of Expression (23a), and the concentration $Q_1$ of the quencher decreases from Qe at a rate of Expression (23b). $k_{n1}$ represents a reaction rate constant of a neutralization reaction between the quencher and the acid. A concentration $M_1$ of the protected polymer in the first baking decreases from an initial concentration $M_0$ at a rate of Expression (23c). $k_{x1}$ represents a reaction rate constant of a deprotection reaction of the polymer. From these expressions and He, Q, and $M_0$, the concentration $H_1$ of the acid at the time of ending the first baking, the concentration $Q_1$ of the quencher, and the concentration $M_1$ of the polymer are calculated using a finite difference method.

$$\frac{dH_1}{dt} = -k_{n1}Q_1 H_1 \quad (23a)$$

$$\frac{dQ_1}{dt} = -k_{n1}Q_1 H_1 \quad (23b)$$

$$\frac{dM_1}{dt} = -k_{X1}M_1 H_1 \quad (23c)$$

In the first baking, the photosensitizer is generated by the decomposition of the photosensitizer precursor, and a concentration $S_1$ of the photosensitizer increases from zero as the initial concentration at a rate of Expression (23d). $k_{s1}$ represents a reaction rate constant of the generation of the photosensitizer by the decomposition of the photosensitizer precursor, $P_1$ represents the concentration of the photosensitizer precursor, and $H_1$ represents the concentration of the acid. The concentration $S_1$ of the photosensitizer increases at the time of ending the first baking is calculated using a finite difference method.

$$\frac{dS_1}{dt} = k_{S1}P_1 H_1 \quad (23d)$$

In the overall exposure, the photo-acid-generating agent decomposes in the presence of the photosensitizer generated by the first baking, and the concentration G thereof decreases at a rate represented by Expression (24). $S_1$ represents the concentration of the photosensitizer at the time of ending the first baking, $C_{h2}$ represents a reaction rate constant of the decomposition of the photo-acid-generating agent (the generation of the acid) by the overall exposure in the presence of the photosensitizer, and $I_F$ represents an intensity of UV in the overall exposure.

$$\frac{dG}{dt} = -C_{h2} I_F S_1 G \tag{24}$$

From Expression (24), Expressions (25a) and (25b) for deriving initial concentrations $G_{2i}$ and $H_{2i}$ of the photo-acid-generating agent and the acid at the time of ending the overall exposure, that is, in the second baking are derived. $G_1$ represents the concentration of the photo-acid-generating agent at the time of ending the first baking, $S_1$ represents the concentration of the photosensitizer at the time of ending the first baking, F represents the exposure amount of the overall exposure, and $H_1$ represents the concentration of the acid at the time of ending the first baking.

$$G_{2i} = G_1 e^{-C_{h2} S_1 I_F t} = G_1 e^{-C_{h2} S_1 F} \tag{25a}$$

$$H_{2i} = H_1 + (G_1 - G) = H_1 + G_1(1 - e^{-C_{h2} S_1 F}) \tag{25b}$$

In the overall exposure, the quencher decomposes due to the action of the photosensitizer, and the concentration Q of the quencher decreases at a rate represented by Expression (26). From Expression (26), Expression (27) for deriving initial concentrations $Q_{2i}$ of the photo-acid-generating agent and the acid at the time of ending the overall exposure, that is, in the second baking is derived. $C_{q2}$ represents a reaction rate constant of the decomposition of the quencher in the presence of the photosensitizer, $I_F$ represents the intensity of UV exposure, $S_1$ represents the concentration of the photosensitizer at the time of ending the first baking, and F represents the exposure amount of the overall exposure.

$$\frac{dQ}{dt} = -C_{q2} I_F S_1 Q \tag{26}$$

$$Q_{2i} = Q_1 e^{-C_{q2} I_F t S_1} = Q_0 e^{-C_{q2} S_1 F} \tag{27}$$

In the second baking, the concentration $H_2$ of the acid decreases from $H_{2i}$ at a rate represented by Expression (28a), and the concentration $Q_2$ of the quencher decreases from $Q_{2i}$ at a rate represented by Expression (28b). $k_{n2}$ represents a reaction rate constant of the neutralization reaction between the quencher and the acid.

$$\frac{dH_2}{dt} = -k_{n2} Q_2 H_2 \tag{28a}$$

$$\frac{dQ_2}{dt} = -k_{n2} Q_2 H_2 \tag{28b}$$

A concentration $M_2$ of the protected polymer in the second baking decreases from the concentration at the time of ending the first baking at a rate represented by Expression (28). $k_{x2}$ represents a reaction rate constant of a deprotection reaction of the polymer, and $H_2$ represents the concentration of the acid.

$$\frac{dM_2}{dt} = -k_{X2} M_2 H_2 \tag{28c}$$

From Expressions (28a), (28b), and (28c), $M_2$, $H_{2i}$, and $Q_{2i}$, the concentration $M_2$ (latent image) of the protected polymer at each position at the time of ending the second baking is calculated using the finite difference method. The value of each $M_2$ is converted to a concentration in of a standardized polymer using Expression (29), whereby a latent image of the standardized concentration m can be obtained. $M_0$ represents an initial concentration of the protected polymer.

$$m = \frac{M_2}{M_0} \tag{29}$$

The concentration m of the standardized polymer may be corrected to a value $m_{dev}$ which takes an influence of an additive on the solubility (level of dissolution inhibition to a developer) of the polymer using Expression (30). $\Delta m_G$, $\Delta m_H$, $\Delta m_Q$, $\Delta m_W$, $\Delta m_P$, $\Delta m_M$, and $\Delta m_X$ are respectively values which reflect an influence of the respective components of the photo-acid-generating agent, the acid generated from the photo-acid-generating agent, the quencher, a weak acid generated by the decomposition of the quencher, the photosensitizer precursor, the photosensitizer, the protected polymer, and the deprotected polymer on the solubility of the resist film in a developer. $d_G$, $d_H$, $d_Q$, $d_W$, $d_P$, and ds are respectively coefficients that indicate the degrees of an influence of the respective additives on development. In a case where a random component A is a component having a higher solubility in a developer than the solubility of the deprotected polymer in a developer, $d_A < 0$. In a case where the random component A is a component having a lower solubility in a developer than the solubility of the deprotected polymer in a developer, $d_A > 0$.

$$m_{dev} = m + \Delta m_G + \Delta m_H + \Delta m_Q + \Delta m_W + \Delta m_P + \Delta m_S \tag{30}$$

$$= m + d_G G + d_H H + d_Q Q + d_W W + d_P P + d_S S$$

Step B

A change rate dm/dx of the concentration of the polymer at the position of the edge of the target pattern is calculated from the obtained value of the concentration m of the standardized polymer at each position. Alternatively, a change rate $dm_{dev}/dx$ corrected from the value of $m_{dev}$ is calculated.

Step C

In a step C, the probabilistic variation in the concentration of the protected polymer at the position of the edge of the target pattern is calculated. In order for that, first, the probabilistic variation in the concentration of the acid after the neutralization reaction in the second baking is calculated. The probabilistic variation in the concentration of the acid attributed to the concentration distributions (variation in concentration) of the photo-acid-generating agent and the quencher is represented by Expression (31a) in the same way of thinking as Expression (10c) of the first embodiment. The probabilistic variation mentioned herein is standardized to a value when the concentration T ($=H_{2i}-Q_{2i}$) of the acid after the neutralization is a threshold value $T_H$ of a deprotection reaction.

$$\left\{\frac{\sigma_T}{\langle N_T \rangle}\right\}_{Ch} = \frac{1}{T_H}\sqrt{\frac{H_{2i}+Q_{2i}}{V}} \tag{31a}$$

The probabilistic variation in the concentration of the acid attributed to the short noise of the photon is represented by Expression (31b) in the same way of thinking as Expression (9c) of the first embodiment. $Q_{1i}$ represents the concentration of the quencher after the pattern exposure, and $\langle N_P \rangle$ represents the average value of the numbers of photons incident on a specific region. Likewise, the probabilistic variation is standardized to a value when the concentration T ($=H_{2i}-Q_{2i}$) of the acid after the neutralization is the threshold value $T_H$ of the deprotection reaction.

$$\left\{\frac{\sigma_T}{\langle N_T \rangle}\right\}_{Ph} = \sqrt{\frac{H_{1i}^2 + (Q_0 - Q_{1i})^2}{T_H \sqrt{\langle N_P \rangle}}} \tag{31b}$$

Next, the probabilistic variation in the concentration of the acid attributed to the concentration distribution (variation in concentration) of the photosensitizer will be studied. The standard deviation of the concentration S of the photosensitizer is represented by Expression (32). $\langle N_S \rangle$ represents the average value of the numbers of the photosensitizers in a specific region having a volume of V. The variation in the concentration of the photosensitizer is represented by Expression (33). $\langle N_Q \rangle$ represents the average value of the numbers of the quenchers in a specific region having a volume of V.

$$\sigma_S = \sqrt{\langle N_S \rangle} = \sqrt{SV} \tag{32}$$

$$\left\{\frac{\sigma_S}{\langle N_S \rangle}\right\}_{Ch} = \frac{\sqrt{\langle N_Q \rangle}}{\langle N_S \rangle} = \frac{\sqrt{SV}}{SV} = \frac{1}{\sqrt{SV}} \tag{33}$$

When assumed to be proportional to the variation in the number of photons, the variation in the concentration H' of the acid generated by the overall exposure which is attributed to the concentration distribution (variation in concentration) of the photosensitizer is represented by Expression (34). $H_1$ represents the concentration of the acid at the time of ending the first baking, $H_{2i}$ represents the concentration of the acid after the overall exposure, and $T_H$ represents a threshold value relating to a deprotection reaction of the concentration of the acid after the neutralization.

$$\frac{H'}{T_H}\left\{\frac{\sigma_{H'}}{\langle N_{H'} \rangle}\right\}_S = \frac{H_{2i}-H_1}{T_H}\frac{1}{\sqrt{SV}} \tag{34}$$

When the amount of the quencher to be decomposed is approximated to be proportional to the number of photons, the variation in the concentration Q' of the quencher to be decomposed by the overall exposure which is attributed to the concentration distribution (variation in concentration) of the photosensitizer is represented by Expression (35). $Q_1$ represents the concentration of the quencher after the first baking, and $Q_{2i}$ represents the concentration of the quencher after the overall exposure.

$$\frac{Q'}{T_H}\left\{\frac{\sigma_{Q}}{\langle N_{Q} \rangle}\right\}_S = \frac{Q_1 - Q_{2i}}{T_H}\frac{1}{\sqrt{SV}} \tag{35}$$

When the concentration T of the acid is the threshold value $T_H$ of the deprotection reaction, the probabilistic variation in the concentration of the acid attributed to the concentration distribution (variation in concentration) of the photosensitizer which takes the concentration of the acid generated by the overall exposure and the decomposition of the quencher into account is represented by Expression (36).

$$\left\{\frac{\sigma_T}{\langle N_T \rangle}\right\}_S = \frac{T_H}{T_H}\left\{\frac{\sigma_T}{\langle N_T \rangle}\right\}_S \tag{36}$$

$$= \sqrt{\left(\frac{H'}{T_H}\left\{\frac{\sigma_H}{\langle N_{H'} \rangle}\right\}_S\right)^2 + \left(\frac{Q'}{T_H}\left\{\frac{\sigma_{Q'}}{\langle N_{Q'} \rangle}\right\}_S\right)^2}$$

$$= \sqrt{\left(\frac{H_{2i}-H_1}{T_H}\frac{1}{\sqrt{SV}}\right)^2 + \left(\frac{Q_1 - Q_{2i}}{T_H}\frac{1}{\sqrt{SV}}\right)^2}$$

$$= \frac{\sqrt{(H_{2i}-H_1)^2 + (Q_1 - Q_{2i})^2}}{T_H\sqrt{SV}}$$

On the basis of the above description, the probabilistic variation standardized with the threshold value $T_H$ of the concentration T of the acid after the neutralization is calculated using Expression (37).

$$\frac{\sigma_T}{\langle N_T \rangle} = \sqrt{\left(\left\{\frac{\sigma_T}{\langle N_T \rangle}\right\}_{Ch}\right)^2 + \left(\left\{\frac{\sigma_T}{\langle N_T \rangle}\right\}_{Ph}\right)^2 + \left(\left\{\frac{\sigma_T}{\langle N_T \rangle}\right\}_S\right)^2} \tag{37}$$

$$= \sqrt{\left(\frac{1}{T_H}\sqrt{\frac{H_{2i}+Q_{2i}}{V}}\right)^2 + \left(\frac{\sqrt{H_{1i}^2 + (Q_0-Q_{1i})^2}}{T_H\sqrt{\langle N_P \rangle}}\right)^2 + \left(\frac{\sqrt{(H_{2i}-H_1)^2+(Q_1-Q_{2i})^2}}{T_H\sqrt{SV}}\right)^2}$$

When assumed to be proportional to the variation in the concentration of the acid, the probabilistic variation in the concentration X of the deprotected polymer which is attributed to the concentration distribution (variation in concentration) of the acid is represented by Expression (38). Here, the concentration X is standardized with the initial concentration $M_0$ of the protected polymer. When the probabilistic variation in the concentration M of the protected polymer is regarded to be the same as the probabilistic variation in the concentration X of the deprotected polymer, the probabilistic variation in the acid of the protected polymer which is attributed to the concentration distribution (variation in concentration) of the acid is represented by Expression (39).

$$\frac{X}{M_0}\frac{\sigma_X}{\langle N_X \rangle} = \frac{X}{M_0}\frac{\sigma_T}{\langle N_T \rangle} \tag{38}$$

-continued $$m\left\{\frac{\sigma_M}{\langle N_M \rangle}\right\}_{Acid} = \frac{M}{M_0}\left\{\frac{\sigma_M}{\langle N_M \rangle}\right\}_{Acid} = \frac{X}{M_0}\frac{\sigma_T}{\langle N_T \rangle} = \frac{M_0 - M}{M_0}\frac{\sigma_T}{\langle N_T \rangle} \quad (39)$$

The standard deviation of the concentration X of the deprotected polymer is represented by Expression (40). $\langle N_X \rangle$ represents the average value of the numbers of the deprotected polymers in a specific region having a volume of V. The probabilistic variation in the concentration X attributed to the concentration distribution of the polymer is represented by Expression (41).

$$\sigma_X = \sqrt{\langle N_X \rangle} = \sqrt{XV} \quad (40)$$

$$\left\{\frac{\sigma_X}{\langle N_X \rangle}\right\}_{Ch} = \frac{\sqrt{\langle N_X \rangle}}{\langle N_X \rangle} = \frac{\sqrt{XV}}{XV} = \frac{1}{\sqrt{XV}} \quad (41)$$

When the probabilistic variation in the concentration M of the protected polymer is regarded to be the same as the variation in the concentration X of the deprotected polymer, the probabilistic variation in the concentration M of the protected polymer after the second baking is represented by Expression (42).

$$m\left\{\frac{\sigma_M}{\langle N_M \rangle}\right\}_{Ch} = \frac{M}{M_0}\left\{\frac{\sigma_M}{\langle N_M \rangle}\right\}_{Ch} = \frac{X}{M_0}\left\{\frac{\sigma_X}{\langle N_X \rangle}\right\}_{Ch} = \frac{X}{M_0}\frac{1}{\sqrt{XV}} = \frac{1}{M_0}\sqrt{\frac{X}{V}} = \frac{1}{M_0}\sqrt{\frac{M_0 - M}{V}} \quad (42)$$

On the basis of the above description, the probabilistic variation in the concentration M of the protected polymer attributed to the concentration distribution of the acid and the concentration distribution of the protected polymer is calculated using Expression (43). $\sigma_T/\langle N_T \rangle$ is calculated using Expression (37).

$$m\frac{\sigma_M}{\langle N_M \rangle} = \frac{M}{M_0}\frac{\sigma_M}{\langle N_M \rangle} \quad (43)$$

$$= \sqrt{\left(\frac{M}{M_0}\left\{\frac{\sigma_M}{\langle N_M \rangle}\right\}_{Acid}\right)^2 + \left(\frac{M}{M_0}\left\{\frac{\sigma_M}{\langle N_M \rangle}\right\}_{Ch}\right)^2}$$

$$= \sqrt{\left(\frac{X}{M_0}\frac{\sigma_T}{\langle N_M \rangle}\right)^2 + \left(\frac{1}{M_0}\sqrt{\frac{X}{V}}\right)^2}$$

Furthermore, the variation in the concentration of the protected polymer may be corrected in consideration of an influence of the variation in solubility in a developer and the concentration of each component included in the resist film to be developed on the solubility of the resist film. The degree of the influence of the variation in the concentration of the random component A on the developability (solubility) of the resist film is represented by Expression (44). $\langle N_A \rangle$ represents the average value of the numbers of the components A in a specific region, $\Delta m_A$ represents a value indicating the degree of an influence of the component A on the concentration m of the polymer, and $d_A$ represents a coefficient indicating the degree of an influence of the component A on the development.

$$\Delta m_A \left\{\frac{\sigma_A}{\langle N_A \rangle}\right\} = \Delta m_A \frac{1}{\sqrt{AV}} = d_A A \frac{1}{\sqrt{AV}} = d_A \sqrt{\frac{A}{V}} \quad (44)$$

Among the components of the resist film, regarding the photosensitizer, an influence of the variation in concentration attributed to the short noise of the photon may be further taken into account using Expressions (45) and (46).

$$\left\{\frac{\sigma_S}{\langle N_S \rangle}\right\}_{Ph} = \left\{\frac{\sigma_T}{\langle N_T \rangle}\right\}_{Ph} \quad (45)$$

$$= \frac{T_H}{T_H}\left\{\frac{\sigma_T}{\langle N_T \rangle}\right\}_{Ph}$$

$$= \sqrt{\left(\frac{H_{1i}}{T_H}\left\{\frac{\sigma_H}{\langle N_H \rangle}\right\}_{Ph}\right)^2 + \left(\frac{Q_{1i}}{T_H}\left\{\frac{\sigma_Q}{\langle N_Q \rangle}\right\}_{Ph}\right)^2}$$

$$= \sqrt{\left(\frac{H_{1i}}{T_H}\frac{1}{\sqrt{\langle N_P \rangle}}\right)^2 + \left(\frac{Q_0 - Q_{1i}}{T_H}\frac{1}{\sqrt{\langle N_P \rangle}}\right)^2}$$

$$= \frac{\sqrt{H_{1i}^2 + (Q_0 - Q_{1i})^2}}{T_H \sqrt{\langle N_P \rangle}}$$

$$\Delta m_S \left\{\frac{\sigma_S}{\langle N_S \rangle}\right\}_{Ph} = d_S S \left\{\frac{\sigma_T}{\langle N_T \rangle}\right\}_{Ph} \quad (46)$$

On the basis of the above description, the probabilistic variation (standard deviation) of the concentration m of the standardized polymer which takes the influence of each component included in the resist film on the developability (solubility) of the resist film into account is calculated using Expression (47). Here, the variation in the concentration M of the protected polymer and the variation in the concentration X of the deprotected polymer are also taken into account.

$$\sigma_{m_{dev}} = \sqrt{\begin{array}{l}\left(m\frac{\sigma_M}{\langle N_M \rangle}\right)^2 + \left(\Delta m_G \frac{\sigma_G}{\langle N_G \rangle}\right)^2 + \left(\Delta m_H \frac{\sigma_H}{\langle N_H \rangle}\right)^2 + \\ \left(\Delta m_Q \frac{\sigma_Q}{\langle N_Q \rangle}\right)^2 + \left(\Delta m_W \frac{\sigma_W}{\langle N_W \rangle}\right)^2 + \left(\Delta m_P \frac{\sigma_P}{\langle N_P \rangle}\right)^2 + \\ \left(\Delta m_S \frac{\sigma_S}{\langle N_S \rangle}\right)^2 + \left(\Delta m_S \left\{\frac{\sigma_X}{\langle N_S \rangle}\right\}_{pH}\right)^2 + \\ \left(\Delta m_M \frac{\sigma_M}{\langle N_M \rangle}\right)^2 + \left(\Delta m_X \frac{\sigma_X}{\langle N_X \rangle}\right)^2 \end{array}} \quad (47)$$

$$= \sqrt{\begin{array}{l}\left(\Delta m_M \frac{\sigma_M}{\langle N_M \rangle}\right)^2 + \left(d_G \sqrt{\frac{G}{V}}\right)^2 + \left(d_H \sqrt{\frac{H}{V}}\right)^2 + \\ \left(d_Q \sqrt{\frac{Q}{V}}\right)^2 + \left(d_W \sqrt{\frac{W}{V}}\right)^2 + \left(d_P \sqrt{\frac{P}{V}}\right)^2 + \\ \left(d_S \sqrt{\frac{S}{V}}\right)^2 + \left(d_S S \left\{\frac{\sigma_T}{\langle N_T \rangle}\right\}_{Ph}\right)^2 + \\ \left(d_M \sqrt{\frac{M}{V}}\right)^2 + \left(d_X \sqrt{\frac{X}{V}}\right)^2 \end{array}}$$

-continued $$= \sqrt{\left(m\frac{\sigma_M}{\langle N_M \rangle}\right)^2 + \frac{d_G^2 G}{V} + \frac{d_H^2 H}{V} + \frac{d_Q^2 Q}{V} + \frac{d_W^2 W}{V} + \frac{d_P^2 P}{V} + \frac{d_S^2 S}{V} + \left(d_S S \left\{\frac{\sigma_T}{\langle N_T \rangle}\right\}_{Ph}\right)^2 + \frac{d_M^2 M}{V} + \frac{d_X^2 X}{V}}$$

Step D

In a step D, a variation in pattern edge roughness (pattern dimension variation) is calculated from the change rate of the concentration calculated in the step B and the probabilistic variation calculated in the step C. As in Expression (48), the dimension of the probabilistic variation is converted to the dimension of the radiation position of the radioactive ray by dividing the probabilistic variation in the concentration of the protected polymer of the step C by the change rate of the protected polymer of the step B, whereby a noise index that is an index of the variation in pattern edge roughness attributed to the probabilistic variation is calculated. Here, $N_{index}$ represents the noise index. A coefficient n is a parameter that regulates in what pattern dimension based on a multiple of the standard deviation to discuss the noise index. As an ordinary example, it is common to discuss the noise index with n of 3. When the noise index $N_{index}$ that is an evaluation function is equal to or less than a certain threshold value, the set pattern formation condition enables determination that the variation in pattern edge roughness is sufficiently decreased even when the stochastics is taken into account.

$$N_{index} = \frac{n\sigma_{m_{dev}}}{\frac{dm_{dev}}{dx}} \quad (48)$$

Step E

Similar to the first embodiment, recalculation is carried out to obtain a smaller noise index $N_{index}$, whereby the formulation of the resist material, the pattern formation condition, and the like are optimized. Alternatively, the formulation of the resist material may be optimized by recalculating the variation in pattern edge roughness by changing the formulation of the resist material or the radiation condition of the radioactive ray and selecting a formulation of the resist material with which the range of the radiation condition of the radioactive ray, in which the variation in pattern edge roughness becomes equal to or less than a target value, becomes wider.

In the above-described method, it is also possible to optimize the formulation of the chemical amplification-type resist material, the pattern formation condition, and the like in the same manner as in the first embodiment by removing the section relating to the photosensitizer precursor in the calculation.

It is also possible to simulate a resist pattern using the method including the step A, the step B, the step C, and the step D exemplified in the first embodiment or the second embodiment and use the result for something other than the optimization of the formulation of the resist material. For example, the radiation condition of the radioactive ray or the target pattern can be optimized using a method in which the variation in the pattern edge roughness of the resist pattern is calculated at positions that continue along an extension direction (a direction along a target pattern edge) of the target pattern using the above-described method, whereby a calculation result of the variation in two-dimensional pattern edge roughness is obtained, and at least one of the radiation condition of the radioactive ray or the target pattern is optimized on the basis of the obtained calculation result. With this method, for example, the shape of a light source of the radioactive ray and the shape of a mask for the pattern exposure may be optimized at the same time. In addition, the result of this simulation may be used to design a target pattern so as to prevent the occurrence of a short circuit in spite of the variation in pattern edge roughness.

Resist Material Having Optimized Formulation

A formulation of the resist material derived according to the above-described optimization method will be described below.

Chemical Amplification-Type Resist Material

A chemical amplification-type resist material according to a first aspect (hereinafter, simply referred to as "first resist material" in some cases) includes a base component, a photo-acid-generating agent, and a photodecomposable quencher, on the basis of the total mass of the resist material, the content of the photo-acid-generating agent is 3% by mass or more, the content of the photodecomposable quencher is 3% by mass or more. The upper limits of these contents are determined in a range in which characteristics do not significantly deteriorate even when the resist material contains the photo-acid-generating agent and the photodecomposable quencher and are approximately 35% by mass or less. In addition, on the basis of the total mass of the resist material, the total proportion of the contents of the photo-acid-generating agent and the photodecomposable quencher is 12% by mass or more. The formulation of the first resist material is a formulation derived by changing the contents of the acid-generating agent and the photodecomposable quencher and calculating the noise index in the above-described optimization method.

Parameters set in simulation for optimizing the formulation of the first resist material are as shown in Table 1.

TABLE 1

| Parameter | Set value |
| --- | --- |
| P: Pattern pitch | 32.00 nm |
| $E_0$: Exposure amount in pattern exposure | 30.00 mJ/cm² |
| a: Offset parameter | 0.65 |
| b: Contrast parameter | 0.55 |
| $C_a$: Acid generation rate (PAG) | 0.035 cm²/mJ |
| $C_b$: Decomposition rate (PDB) | 0.035 cm²/mJ |
| V: Volume of specific region | 1080 nm³ |
| $\langle N_P \rangle$: Average number of photons incident on specific region | 71.6 |

The content of the photo-acid-generating agent may be 3% to 35% by mass, 5% to 35% by mass, 10% to 35% by mass, or 20% to 35% by mass on the basis of the total mass of the resist material. As the content of the photo-acid-generating agent increases in the above-described range, it is possible to suppress the noise index on a lower level.

In addition, the content of the photodecomposable quencher may be 3% to 35% by mass, 5% to 35% by mass, 10% to 35% by mass, or 20% to 35% by mass on the basis of the total mass of the resist material. As the content of the photodecomposable quencher increases in the above-described range, it is possible to suppress the noise index on a lower level. In addition, in the optimization of the formulation of the first resist material, the exposure amount $E_0$ in the pattern exposure is set to 30 mJ/cm². In this case, when the contents of the photo-acid-generating agent and the photodecomposable quencher are 5% by mass, it is possible to sufficiently leave the acid after the pattern exposure, and it is possible to reduce the variation in pattern dimensions.

Figure 4:
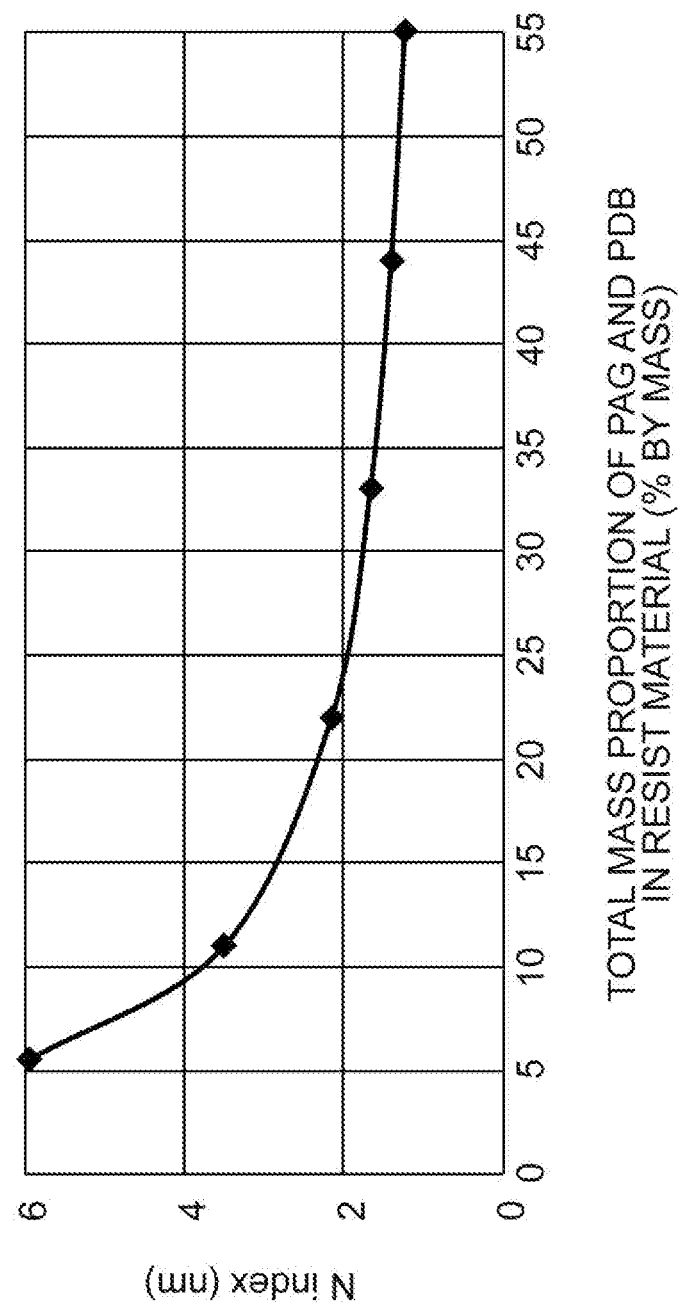
FIG. 4 is a graph illustrating an example of a behavior of a noise index $N_{index}$ (nm) when a total mass proportion of a photo-acid-generating agent (PAG) and a photodecomposable quencher (PDB) in a resist material is changed in the optimization method according to an embodiment of the present disclosure.

Furthermore, in the first resist material, on the basis of the total mass of the resist material, the total of the contents of the photo-acid-generating agent and the photodecomposable quencher is 12% by mass or more. FIG. 4 is a graph illustrating an example of the behavior of the noise index $N_{index}$ (nm) when the total mass proportion of the photo-acid-generating agent (PAG) and the photodecomposable quencher (PDB) in the resist material is changed in the above-described optimization method. As is clear from the graph of FIG. 4, as the total of the contents of the photo-acid-generating agent and the photodecomposable quencher increases, the noise index $N_{index}$ decreases. It can be said that, in a case where the total of the contents of the photo-acid-generating agent and the photodecomposable quencher is 12% by mass or more, the pattern dimension variation is favorable. In addition, from the viewpoint of obtaining a lower noise index $N_{index}$, the total of the contents of the photo-acid-generating agent and the photodecomposable quencher may be 15% by mass or more, 20% by mass or more, 30% by mass or more, 40% by mass or more, or 50% by mass or more.

The content of the base component may be 6% to 70% by mass, 8% to 60% by mass, 10% to 50% by mass, or 10% to 40% by mass on the basis of the total mass of the resist material.

As the photo-acid-generating agent and the photodecomposable quencher, for example, an onium salt compound, a diazomethane compound, a sulfonimide compound, and the like are exemplified. In addition, as the onium salt compound, for example, a sulfonium salt compound, a tetrahydrothiophenium salt compound, an iodonium compound, and the like are exemplified. The acid generation rate of the photo-acid-generating agent and the decomposition rate of the photodecomposable quencher mainly depend on the structure of a cation portion of the above-described compound. The acid generation rate of the photo-acid-generating agent in the first resist material may be 0.001 to 2 $cm^2/mJ$, may be 0.01 to 0.1 $cm^2/mJ$, or may be 0.02 to 0.05 $cm^2/mJ$. In addition, the decomposition rate of the photodecomposable quencher in the first resist material may be 0.001 to 2 $cm^2/mJ$, may be 0.01 to 0.1 $cm^2/mJ$, or may be 0.02 to 0.05 $cm^2/mJ$. The acid generation rate of the photo-acid-generating agent and the decomposition rate of the photodecomposable quencher are values obtained when a radioactive ray having a wavelength of 13.5 nm (EUV) is radiated.

In a case where the resist material includes a plurality of kinds of the onium salt compound and the like, whether these compounds function as the photo-acid-generating agent or function as the photodecoposable quencher is determined depending on the kind of an anion portion. That is, among the plurality of kinds of the onium salt compound and the like, a compound having a stronger acid as an anion serves as the photo-acid-generating agent, and a compound having a weaker acid serves as the photodecomposable quencher. As the anion, a sulfonic acid group, a sulfonic acid group substituted with a halogen atom, a carboxylic acid group, a carboxylic acid group substituted with a halogen atom, a bis(alkylsulfonyl)amide group, a bis(alkylsulfonyl) amide group substituted with a halogen atom, a tris(alkylsulfonyl)methide group, a tris(alkylsulfonyl)methide group substituted with a halogen atom, and the like are exemplified. In a case where the anon is substituted with a halogen atom, particularly, a fluorine atom, the anion tends to become a stronger acid. In order for the onium salt compound and the like to be the photo-acid-generating agent, the anion may be a super strong acid that can be dissociated even in the resist film.

As the base component, for example, polymer compounds such as a phenol resin, a (meth)acrylic resin, a polyvinyl acetal resin, a polyurethane resin, a polyamide resin, an epoxy resin, a styrene-based resin, and a polyester resin are exemplified. It is preferable that the polymer compound has a polar group and the polar group is protected by an acid unstable group.

The first resist material may include a photosensitizer precursor that generates a photosensitizer by being radiated by a radioactive ray having a wavelength of 300 nm or less. In this case, the first resist material becomes a photosensitization chemical amplification-type resist material. In addition, the first resist material may include an acid-photosensitizer-generating agent having both a function of a photo-acid-generating agent that generates an acid by being radiated by a radioactive ray having a wavelength of 300 nm or less and a function of a photosensitizer precursor that generates a photosensitizer by being radiated by the radioactive ray.

In a case where the first resist material includes a photosensitizer precursor, the content of the photosensitizer precursor can be, for example, 0.1 to 30 parts by mass, can be 0.1 to 15 parts by mass, or can be 0.1 to 5 parts by mass with respect to 100 parts by mass of the base component. In addition, in a case where the first resist material includes an acid-photosensitizer-generating agent, the content of the acid-photosensitizer-generating agent can be, for example, 0.1 to 30 parts by mass, can be 0.1 to 15 parts by mass, or can be 0.1 to 5 parts by mass with respect to 100 parts by mass of the base component.

Furthermore, the first resist material may include a light absorption shift-type photo-acid-generating agent. The light absorption shift-type photo-acid-generating agent has both a function of a photo-acid-generating agent that generates an acid by being radiated by a radioactive ray having a wavelength of 300 nm or less and a function of enhancing the decomposition reactivity of the acid-generating agent only in a radioactive ray-radiated portion during the overall exposure in which a wavelength of 300 nm or more is used by changing the absorption of the acid-generating agent using an acid. That is, the photo-acid-generating agent in the first resist material may be a light absorption shift-type photo-acid-generating agent. The light absorption shift-type photo-acid-generating agent has an acid unstable group that is removed by the radiation of a radioactive ray having a wavelength of 300 nm or less. When the acid unstable group is removed, an acid is generated by the radiation of a radioactive ray having a wavelength of more than 300 nm.

The first resist material may also appropriately include a crosslinking agent, an additive, a solvent, and the like as long as the effect of the optimization method is not impaired.

In a case where the resist material includes the crosslinking agent, the content of the crosslinking agent is, for example, 40 parts by mass or less, 0.1 to 25 parts by mass, or 0.2 to 10 parts by mass with respect to 100 parts by mass of the base component.

In a case where the resist material includes the crosslinking agent, the content of the additive is, for example, 30 parts by mass or less, 0.1 to 10 parts by mass, or 0.2 to 5 parts by mass with respect to 100 parts by mass of the base component.

In a case where the resist material includes the crosslinking agent, the content of the solvent is, for example, 200 to 10,000 parts by mass or 300 to 5,000 parts by mass with respect to 100 parts by mass of the base component.

A chemical amplification-type resist material according to a second aspect (hereinafter, simply referred to as "second resist material" in some cases) includes a base component, a photo-acid-generating agent, and a photodecomposable quencher, and the ratio of the decomposition rate of the photodecomposable quencher to the decomposition rate of the photo-acid-generating agent is 0.6 to 2.0. The formulation of the second resist material is a formulation derived by changing the decomposition rates of the acid-generating agent and the photodecomposable quencher and calculating the noise index in the above-described optimization method. The decomposition rates of the photo-acid-generating agent and the photodecomposable quencher are values obtained when a radioactive ray having a wavelength of 13.5 nm (EUV) is radiated.

Parameters set in simulation for optimizing the formulation of the second resist material are as shown in Table 2.

TABLE 2

| Parameter | Set value |
| --- | --- |
| P: Pattern pitch | 32.00 nm |
| $E_0$: Exposure amount in pattern exposure | 30.00 mJ/cm$^2$ |
| a: Offset parameter | 0.65 |
| b: Contrast parameter | 0.55 |
| $A_0$: Number in resist film before radiation of radioactive ray (PAG) | 0.24 to 0.37 number/nm$^3$ |
| $B_0$: Number in resist film before radiation of radioactive ray (PDB) | 0.13 to 0.26 number/nm$^3$ |
| V: Volume of specific region | 1080 nm$^3$ |
| <$N_P$>: Average number of photons incident on specific region | 71.6 |

Figure 5:
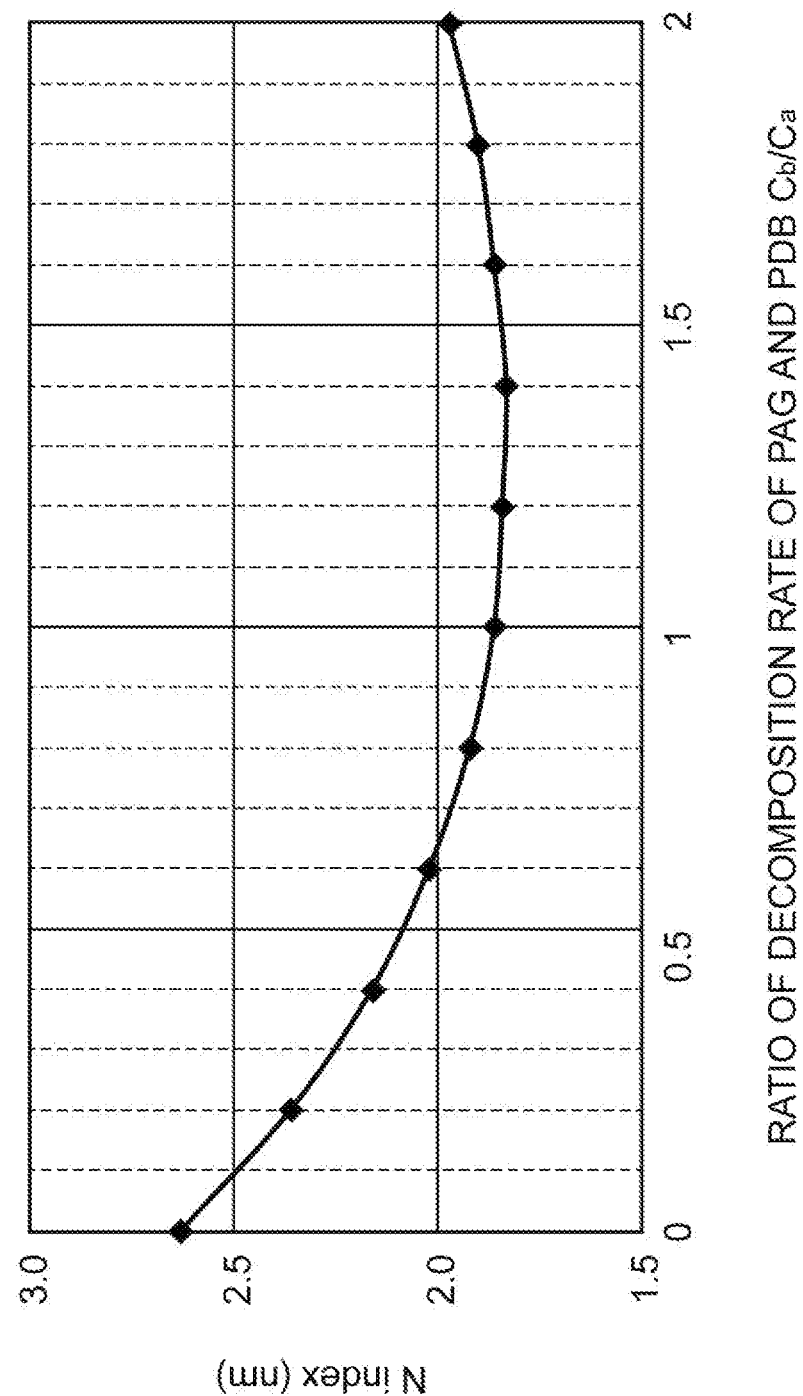
FIG. 5 is a graph illustrating an example of the behavior of the noise index $N_{index}$ (nm) when a ratio $(C_b/C_a)$ of a decomposition rate of the photodecomposable quencher (PDB) to a decomposition rate of the photo-acid-generating agent (PAG) in the resist material is changed in the optimization method according to an embodiment of the present disclosure.

FIG. 5 is a graph illustrating an example of the behavior of the noise index $N_{index}$ (nm) when the ratio ($C_b/C_a$) of the decomposition rate of the photodecomposable quencher (PDB) to the decomposition rate of the photo-acid-generating agent (PAG) in the resist material is changed in the above-described optimization method. As is clear from FIG. 5, it is possible to confirm that, when the ratio ($C_b/C_a$) is in a range of 0.6 to 2.0, the noise index $N_{index}$ (nm) is low and the pattern dimension variation is small. According to the second resist material, it is possible to decrease the concentration of the quencher in the pattern edge portion, and it is possible to suppress the variation in pattern dimensions attributed to the concentration variation of the quencher.

The photo-acid-generating agent has a decomposition rate intrinsic to the chemical structure and tends to have a faster decomposition rate as light absorption becomes stronger or the electron trapping capability becomes stronger and to have a slower decomposition rate as light absorption becomes weaker or the electron trapping capability becomes weaker.

In a case where the photo-acid-generating agent is, for example, a sulfonium salt, when an electron-drawing substituent enters a sulfonium cation portion, the reduction potential increases, and the decomposition property becomes strong.

Similarly, the photodecomposable quencher also has a decomposition rate intrinsic to the chemical structure and tends to have a faster decomposition rate as light absorption becomes stronger or the electron trapping capability becomes stronger and have a slower decomposition rate as light absorption becomes weaker or the electron trapping capability becomes weaker.

In a case where the photodecomposable quencher is, for example, a sulfonium salt, when an electron-drawing substituent enters a sulfonium cation portion, the reduction potential increases, and the decomposition property becomes strong.

As the base component, the same component as in the first resist material can be used.

The content of the photo-acid-generating agent in the second resist material is 3 to 50 parts by mass and may be 15 to 40 parts by mass with respect to 100 parts by mass of the base component. When the content of the photo-acid-generating agent is 3 parts by mass or more, it is easy to obtain a sufficient sensitivity, and, when the content is 50 parts by mass or less, it is easy to obtain a rectangular resist pattern.

The content of the photodecomposable quencher in the second resist material is 3 to 20 parts by mass and may be 5 to 40 parts by mass with respect to 100 parts by mass of the base component. When the content of the photodecomposable quencher is 3 parts by mass or more, it is easy to improve the contrast of the latent image of the acid.

The second resist material may also appropriately include a crosslinking agent, an additive, a solvent, and the like as long as the effect of the optimization method is not impaired. The content thereof is the same as in the first resist material.

The second resist material may include a photosensitizer precursor that generates a photosensitizer by being radiated by a radioactive ray having a wavelength of 300 nm or less. In this case, the second resist material becomes a photosensitization chemical amplification-type resist material. In addition, the second resist material may include an acid-photosensitizer-generating agent having both a function of a photo-acid-generating agent that generates an acid by being radiated by a radioactive ray having a wavelength of 300 nm or less and a function of a photosensitizer precursor that generates a photosensitizer by being radiated by the radioactive ray. In a case where the second resist material includes a photosensitizer precursor or an acid-photosensitizer-generating agent, the content thereof can be the same as the range of the content in the first resist material.

Furthermore, the second resist material may include a light absorption shift-type photo-acid-generating agent. The light absorption shift-type photo-acid-generating agent has both a function of a photo-acid-generating agent that generates an acid by being radiated by a radioactive ray having a wavelength of 300 nm or less and a function of enhancing the decomposition reactivity of the acid-generating agent only in a radioactive ray-radiated portion during the overall exposure in which a wavelength of 300 nm or more is used by changing the absorption of the acid-generating agent using an acid. That is, the photo-acid-generating agent in the second resist material may be a light absorption shift-type photo-acid-generating agent. The light absorption shift-type photo-acid-generating agent has an acid unstable group that is removed by the radiation of a radioactive ray having a wavelength of 300 nm or less. When the acid unstable group is removed, an acid is generated by the radiation of a radioactive ray having a wavelength of more than 300 nm.

The second resist material, similar to the first resist material, may also appropriately include a crosslinking agent, an additive, a solvent, and the like as long as the effect of the optimization method is not impaired. The ranges of the contents of the above-described materials in the second resist material can be the same as the ranges of the contents in the first resist material.

Figure 6:
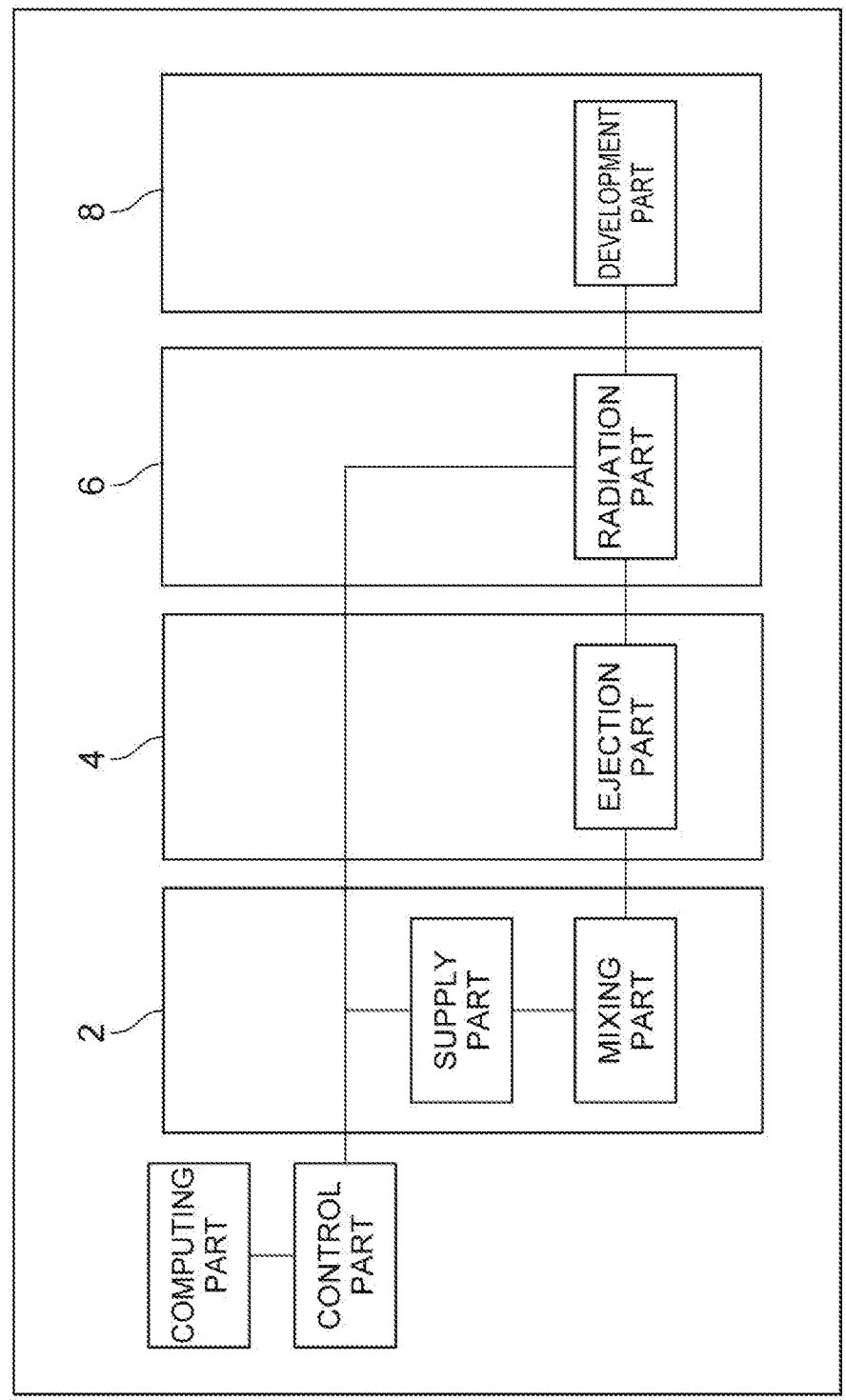
FIG. 6 is a block diagram illustrating a configuration of an apparatus according to an embodiment of the present disclosure.

Apparatus Including Computing Part that Executes Optimization Method of Formulation of Resist Material and the Like An embodiment of an apparatus including a computing part that executes the optimization method of the formulation of the resist material and the like will be described below. FIG. 6 is a block diagram illustrating the configuration of an apparatus according to an embodiment of the present disclosure. As illustrated in FIG. 6, an apparatus 10 according to the present embodiment includes a preparation device 2, an application device 4, an exposure device 6, and a development device 8, the preparation device 2 includes a supply part and a mixing part, the application device 4 includes an ejection part, the exposure device 6 includes a radiation part, and the development device 8 includes a development part.

The apparatus 10 further includes a computing part and a control part, and the above-described optimization method is carried out in the computing part. The computing part sends a command to control the supply part to the control part on the basis of information relating to the optimized formulation of the resist material. The computing part also sends a command to control the radiation part to the control part on the basis of information relating to the optimized radiation condition of a radioactive ray.

The control part controls the supply part and the radiation part according to the commands from the computing part. Therefore, a resist pattern can be formed using a resist material having an optimized formulation under an optimized radiation condition of a radioactive ray.

The supply part is controlled using the control part and supplies appropriate materials that configure the resist material in an appropriate amount ratio to a mixture. The mixing part mixes the materials supplied from the supply part. The resist material is obtained by mixing. The obtained resist material is supplied to the application device 4. The resist material is ejected onto a substrate from the ejection part. A formed coated film is dried as necessary and turns into a resist film. The substrate having the resist film formed thereon is supplied to the exposure device 6. A radioactive ray having a wavelength of 300 nm or less is radiated to the resist film from the radiation part. The resist film to which the radioactive ray has been radiated is dried as necessary, and a deprotection reaction, a crosslinking reaction, or the like of the base component caused by an acid generated by the radiation of the radioactive ray is accelerated. The substrate having the resist film, to which the radioactive ray has been radiated, formed thereon is supplied to the development device 8. The resist film is brought into contact with a developer in the development part, thereby selectively melting or removing the resist film in a radioactive ray-radiated part or a non-radioactive ray-radiated part. The resist material is prepared and the resist pattern is formed in the apparatus 10 as described above.

The apparatus in the present disclosure needs to include the computing part, the control part, and the preparation part (the supply part and the mixing part), but may not include the application device, the exposure device, and the development device. In addition, in the above description, a case where the computing part and the control part are outside the preparation device and the like has been illustrated in FIG. 6 or the like, but the parts may be embedded in the preparation device and the like.

In addition, the computing part may be imparted with a function of recording a program that executes the optimization method by a recording medium in which the program is recorded. In this case, the apparatus further includes a reading part (not illustrated) that reads the program from the recording medium.

Recording Medium in which Program for Executing Optimization Method is Recorded

An embodiment of a computer-readable recording medium in which a program that execute the optimization method is recorded will be described below. As the recording medium, for example, a hard disk, a compact disk, a flash memory, a flexible disk, a memory card, and the like are exemplified. In the recording medium, a program for executing the method including the step A to the step E is recorded, but a method of executing the program may not include the step E.

According to the present disclosure, a method of efficiently optimizing the formulation of a resist material and a pattern formation condition that are applicable to the formation of an extremely fine resist pattern from which a probabilistic variation (stochastics) can be caused is provided. In addition, according to the present disclosure, a resist material that is applicable to the formation of an extremely fine resist pattern, and an apparatus and a recording device to which the optimization method is applied are provided.

What is claimed is:

1. A method of simulating a resist pattern that is formed through a step of radiating a radioactive ray having a wavelength of 300 nm or less to a resist film formed of a resist material along a target pattern,
    wherein the resist material includes a polymer protected by a protective group, and the resist pattern is formed by treating the resist film with a developer that dissolves the polymer deprotected,
    the method comprising:
    (A) a step of calculating a latent image of a concentration of the polymer in the resist film that is to be treated with the developer with respect to a radiation position of the radioactive ray, the polymer being the polymer protected by the protective group or the polymer deprotected;
    (B) a step of calculating a change rate of the concentration with respect to the radiation position at an edge of the target pattern on the basis of the latent image;
    (C) a step of calculating a probabilistic variation in the concentration at the edge of the target pattern; and
    (D) a step of calculating a variation in pattern edge roughness from the change rate of the concentration and the probabilistic variation in the concentration,
    wherein the change rate of the concentration is calculated on the basis of the latent image of the concentration corrected by: a solubility of a component included in the resist film that is to be treated with the developer in the developer; and a concentration of the component, such that an influence of the component on a solubility of the resist film in the developer is reflected, and
    the probabilistic variation in the concentration is corrected by: the solubility of the component in the developer; and a variation in the concentration of the component, such that the influence of the component included in the resist film that is to be treated with the developer on the solubility of the resist film in the developer is reflected.

2. A method of simulating a resist pattern that is formed through a step of radiating a radioactive ray having a wavelength of 300 nm or less to a resist film formed of a resist material along a target pattern, the method comprising:
    (A) a step of calculating a latent image of a concentration of an active species in the resist film that has been radiated by the radioactive ray along the target pattern with respect to a radiation position of the radioactive ray;

(B) a step of calculating a change rate of the concentration with respect to the radiation position at an edge of the target pattern on the basis of the latent image;

(C) a step of calculating a probabilistic variation in the concentration at the edge of the target pattern; and (D) a step of calculating a variation in pattern edge roughness from the change rate of the concentration and the probabilistic variation in the concentration, wherein the resist material includes a photo-acid-generating agent and a photodecomposable quencher, and amounts of a radioactive ray that is absorbed by the photo-acid-generating agent and the photodecomposable quencher are approximated to amounts of the radioactive ray distributed to the photo-acid-generating agent and the photodecomposable quencher in the same ratio as a ratio between concentrations of the photo-acid-generating agent and the photodecomposable quencher before the radioactive ray is radiated to the resist film.

3. The method according to claim 2, wherein
the resist material is a chemical amplification-type resist material, and
the active species in the step (A) is an acid.

4. The method according to claim 2, wherein
the resist material is a photosensitization chemical amplification-type resist material further including a photosensitizer precursor, and
the active species in the step (A) is an acid.

5. A method of simulating a resist pattern that is formed through a step of radiating a radioactive ray having a wavelength of 300 nm or less to a resist film formed of a resist material along a target pattern, wherein the resist material includes a polymer protected by a protective group, and the resist pattern is formed by treating the resist film with a developer that dissolves the polymer deprotected, the method comprising:

(A) a step of calculating a latent image of a concentration of the polymer in the resist film that is to be treated with the developer with respect to a radiation position of the radioactive ray, the polymer being the polymer protected by the protective group or the polymer deprotected;

(B) a step of calculating a change rate of the concentration with respect to the radiation position at an edge of the target pattern on the basis of the latent image;

(C) a step of calculating a probabilistic variation in the concentration at the edge of the target pattern; and (D) a step of calculating a variation in pattern edge roughness from the change rate of the concentration and the probabilistic variation in the concentration, wherein the resist material includes a photo-acid-generating agent and a photodecomposable quencher, and amounts of a radioactive ray that is absorbed by the photo-acid-generating agent and the photodecomposable quencher are approximated to amounts of the radioactive ray distributed to the photo-acid-generating agent and the photodecomposable quencher in the same ratio as a ratio between concentrations of the photo-acid-generating agent and the photodecomposable quencher before the radioactive ray is radiated to the resist film.

6. A method of simulating a resist pattern that is formed through a step of radiating a radioactive ray having a wavelength of 300 nm or less to a resist film formed of a resist material along a target pattern, the method comprising:

(A) a step of calculating a latent image of a concentration of an active species in the resist film that has been radiated by the radioactive ray along the target pattern with respect to a radiation position of the radioactive ray;

(B) a step of calculating a change rate of the concentration with respect to the radiation position at an edge of the target pattern on the basis of the latent image;

(C) a step of calculating a probabilistic variation in the concentration at the edge of the target pattern; and (D) a step of calculating a variation in pattern edge roughness from the change rate of the concentration and the probabilistic variation in the concentration, wherein the resist material includes a photo-acid-generating agent and a quencher, and the change rate of the concentration and the probabilistic variation in the concentration are calculated from a calculation expression including:

a concentration of the photo-acid-generating agent before radiation of the radioactive ray;

a concentration of the quencher before the radiation of the radioactive ray; a reaction rate of generation of an acid from the photo-acid-generating agent by the radioactive ray; and a reaction rate of decomposition of the quencher by the radioactive ray, as parameters.

7. A method of simulating a resist pattern that is formed through a step of radiating a radioactive ray having a wavelength of 300 nm or less to a resist film formed of a resist material along a target pattern, wherein the resist material includes a polymer protected by a protective group, and the resist pattern is formed by treating the resist film with a developer that dissolves the polymer deprotected, the method comprising:

(A) a step of calculating a latent image of a concentration of the polymer in the resist film that is to be treated with the developer with respect to a radiation position of the radioactive ray, the polymer being the polymer protected by the protective group or the polymer deprotected;

(B) a step of calculating a change rate of the concentration with respect to the radiation position at an edge of the target pattern on the basis of the latent image;

(C) a step of calculating a probabilistic variation in the concentration at the edge of the target pattern; and (D) a step of calculating a variation in pattern edge roughness from the change rate of the concentration and the probabilistic variation in the concentration, wherein the resist material includes a photo-acid-generating agent and a quencher, and the change rate of the concentration and the probabilistic variation in the concentration are calculated from a calculation expression including:

a concentration of the photo-acid-generating agent before radiation of the radioactive ray;

a concentration of the quencher before the radiation of the radioactive ray; a reaction rate of generation of an acid from the photo-acid-generating agent by the radioactive ray; and a reaction rate of decomposition of the quencher by the radioactive ray, as parameters.

8. A method of optimizing a formulation of a resist material, wherein the resist material is intended to form a resist pattern through a step of radiating a radioactive ray having a wavelength of 300 nm or less to a resist film formed of the resist material along a target pattern, the method comprising:

calculating a variation in pattern edge roughness of the resist pattern using a method of simulating the resist pattern that is formed through a step of radiating the radioactive ray having the wavelength of 300 nm or less to the resist film formed of the resist material along the target pattern, the method of simulating the resist pattern comprising:

(A) a step of calculating a latent image of a concentration of an active species in the resist film that has been radiated by the radioactive ray along the target pattern with respect to a radiation position of the radioactive ray;

(B) a step of calculating a change rate of the concentration with respect to the radiation position at an edge of the target pattern on the basis of the latent image;

(C) a step of calculating a probabilistic variation in the concentration at the edge of the target pattern; and (D) a step of calculating a variation in pattern edge roughness from the change rate of the concentration and the probabilistic variation in the concentration; and recalculating the variation in pattern edge roughness by changing the formulation of the resist material or a radiation condition of the radioactive ray, and thereby selecting a formulation of the resist material with which a range of the radiation condition of the radioactive ray that leads the variation in pattern edge roughness of a target value or less, becomes wider.

9. A method of optimizing a formulation of a resist material, wherein the resist material is intended to form a resist pattern through a step of radiating a radioactive ray having a wavelength of 300 nm or less to a resist film formed of the resist material along a target pattern, the method comprising:

calculating a variation in pattern edge roughness of the resist pattern using a method of simulating the resist pattern that is formed through a step of radiating the radioactive ray having the wavelength of 300 nm or less to the resist film formed of the resist material along the target pattern, wherein the resist material includes a polymer protected by a protective group, and the resist pattern is formed by treating the resist film with a developer that dissolves the polymer deprotected, and the method of simulating the resist pattern comprises:

(A) a step of calculating a latent image of a concentration of the polymer in the resist film that is to be treated with the developer with respect to a radiation position of the radioactive ray, the polymer being the polymer protected by the protective group or the polymer deprotected;

(B) a step of calculating a change rate of the concentration with respect to the radiation position at an edge of the target pattern on the basis of the latent image;

(C) a step of calculating a probabilistic variation in the concentration at the edge of the target pattern; and (D) a step of calculating a variation in pattern edge roughness from the change rate of the concentration and the probabilistic variation in the concentration; and recalculating the variation in pattern edge roughness by changing the formulation of the resist material or a radiation condition of the radioactive ray, and thereby selecting a formulation of the resist material with which a range of the radiation condition of the radioactive ray that leads the variation in pattern edge roughness of a target value or less, becomes wider.

* * * * *